United States Patent
Hwang

(10) Patent No.: US 9,435,853 B2
(45) Date of Patent: Sep. 6, 2016

(54) SOCKET DEVICE FOR AN IC TEST
(71) Applicant: HICON CO., LTD., Gyeonggido (KR)
(72) Inventor: Dong Weon Hwang, Seoul (KR)
(73) Assignee: HICON CO., LTD., Seongnam-si, Gyeonggi-do (KR)
( * ) Notice: Subject to any disclaimer, the term of this patent is extended or adjusted under 35 U.S.C. 154(b) by 144 days.
(21) Appl. No.: 14/346,813
(22) PCT Filed: Sep. 18, 2012
(86) PCT No.: PCT/KR2012/007455
§ 371 (c)(1),
(2) Date: Mar. 24, 2014
(87) PCT Pub. No.: WO2013/042919
PCT Pub. Date: Mar. 28, 2013

(65) Prior Publication Data
US 2014/0239993 A1    Aug. 28, 2014

(30) Foreign Application Priority Data
Sep. 23, 2011    (KR) .................. 10-2011-0096310

(51) Int. Cl.
*G01R 31/28* (2006.01)
*G01R 1/04* (2006.01)
(52) U.S. Cl.
CPC ......... *G01R 31/2886* (2013.01); *G01R 1/0466* (2013.01)
(58) Field of Classification Search
CPC ....... G01R 31/28; G01R 33/07; H01R 13/62
See application file for complete search history.

(56) References Cited

U.S. PATENT DOCUMENTS

| | | | | |
|---|---|---|---|---|
| 5,733,136 A * | 3/1998 | Kajiwara | ............... | H01R 12/89 439/259 |
| 5,788,513 A * | 8/1998 | Kajiwara | ............. | H05K 7/1092 439/331 |
| 6,636,060 B1 | 10/2003 | Saito | | |
| 7,134,892 B2 | 11/2006 | Hayakawa | | |
| 7,828,575 B2 * | 11/2010 | Hwang | ................ | G01R 1/0466 439/331 |
| 7,874,863 B1 * | 1/2011 | Hwang | ................ | G01R 1/0466 439/331 |
| 2002/0037672 A1 * | 3/2002 | Min | ..................... | H01R 12/585 439/751 |
| 2006/0094280 A1 | 5/2006 | Hayakawa | | |
| 2006/0205247 A1 | 9/2006 | Kunioka et al. | | |

(Continued)

FOREIGN PATENT DOCUMENTS

| | | |
|---|---|---|
| CN | 101103451 A | 1/2008 |
| JP | 10-144439 A | 5/1998 |
| JP | 11-176547 A | 7/1999 |
| JP | 2001-033519 A | 2/2001 |
| JP | 2001-159655 A | 6/2001 |
| JP | 2002-071749 A | 3/2002 |
| JP | 2003-187937 A | 7/2003 |
| JP | 2003-317890 A | 11/2003 |
| JP | 2004-355983 A | 12/2004 |
| JP | 2006-127937 A | 5/2006 |
| JP | 2006-286613 A | 10/2006 |
| KR | 10-2003-0010423 A | 2/2003 |
| KR | 10-2004-0004878 A | 1/2004 |
| KR | 10-2009-0011498 A | 2/2009 |

*Primary Examiner* — Jermele M Hollington
*Assistant Examiner* — Alvaro Fortich
(74) *Attorney, Agent, or Firm* — Rabin & Berdo, P.C.

(57) ABSTRACT

Disclosed herein is a socket device for an integrated circuit (IC) test. The device includes: a socket which is provided with a pin guide plate that can guide and protect a spring contact so as to prevent damage to or breakage of the spring contact that electrically connects an IC lead to a PCB; and an IC insert provided with a guide plate. According to said configuration, ball grid array (BGA) ICs in which IC leads are balls can be more efficiently tested. Particularly, contact pins of the socket and the IC leads can be mechanically and electrically more precisely positioned for narrow pitches of the IC leads such as 0.4 mm, 0.35 mm, and 0.3 mm. Thereby, damage to or breakage not only of the ICs to be tested but also of the socket can be minimized.

15 Claims, 27 Drawing Sheets

(56) References Cited

U.S. PATENT DOCUMENTS

| | | | |
|---|---|---|---|
| 2007/0026699 A1* | 2/2007 | Tahahashi | H01R 12/714 439/66 |
| 2008/0050944 A1* | 2/2008 | Oda | H01R 13/2421 439/68 |
| 2008/0207036 A1* | 8/2008 | Hwang | G01R 1/0483 439/331 |
| 2009/0215291 A1* | 8/2009 | Taguchi | H01R 12/57 439/83 |
| 2010/0248518 A1* | 9/2010 | Takahashi | H01R 12/7082 439/331 |

* cited by examiner

SOCKET DEVICE FOR AN IC TEST

TECHNICAL FIELD

The present invention relates, in general, to socket devices for IC (integrated circuit) tests and, more particularly, to a socket device for IC tests which can effectively test various kinds of ICs which are classified, according to the type of electrode lead of an IC package, into BGA (ball grid array) ICs that are ball type ICs, LGA (land grid array) ICs that are land type ICs, and several other types of ICs, the socket device being capable of minimizing damage to or breakage of not only ICs that are test targets but also the socket.

Specially, the present invention relates to a socket device for IC tests which can effectively test even a narrow pitch IC having a pitch of 0.4 mm or less in consideration of the facts that it must be possible to electrically connect leads of an IC to a socket board repeatedly and precisely to test next generation narrow pitch ICs having lead pitches of 0.4 mm or less, for example, 0.35 mm, 0.30 mm, etc., and the conventional socket structures have many problems, e.g., a problem of low test efficiency.

BACKGROUND ART

Recently, as wireless communication devices such as smart phones are rapidly developed, various kinds of ICs, for example, BGA ICs having 200 or more lead balls and a 0.4 mm or less pitch, are developed and produced, and such ICs are required to be adapted for mass production.

Generally, ICs, the leads of which are arranged on a perimeter of an IC in two rows, for example, as shown in FIG. 1, a BGA IC 1 that has 280 balls 2 and 0.4 mm lead pitch, are mainly produced.

In the following description, the same reference numerals are used throughout the different drawings to designate the same or similar components, and designation of the same reference numerals will be omitted in some drawings.

As shown in FIGS. 2 and 3, to test an IC 1, a conventional IC test method includes electrically connecting lead balls 2 of an IC to respective upper pins 13 of spring contacts of a socket 15, and electrically connecting lower pins of socket contacts to a PCB 16.

An important point of the conventional IC test method is that the socket device must be able to repeatedly test ICs with lead balls having a diameter of 0.25 mm tens of thousands of times. Here, the socket device generally includes the PCB 16, the socket 15, a socket guide 17, an IC insert 20 and an IC pusher 23. Ultimately, it is very significant that the upper pins 13 of the socket contacts must be reliably connected to the corresponding IC balls mechanically and electrically.

More precisely, a test is conducted, after the IC balls 2 of the IC are disposed on the respective upper pins 13 of the socket contact without being displaced from the correct positions and the IC is pushed until the upper pins 13 of the contacts that have been in contact with the respective IC balls are compressed by 0.3 mm to make electrical connection reliable.

Problems that have occurred in the conventional IC test method for many years are derived from the fact that the IC balls 2 of the IC must be precisely disposed on the respective upper pins 13 of the socket contact without being displaced from the correct positions. The reason of occurrence of these problems is because dimension tolerances of components and machining accumulated tolerances make it difficult to precisely dispose the IC balls 2 of the IC on the respective upper pins 13 of the socket contact without being displaced from the correct positions when components are assembled with each other. The above problems may induce damage, deformation or breakage, particularly, of the upper pins 13 of the socket contacts. In this case, the damaged or deformed upper pins may come into contact with the bottom of the IC or other neighboring balls of the IC, thus resulting in damage to the IC or a reduction of a test yield rate.

In more detail, the dimension of an IC with dimensional tolerance is 14.00+/−0.10 mm×16.5+/−0.10 mm. That is, although the length of the IC is 16.5 mm, it is allowed if it is within a range from 16.40 mm to 16.60 mm. The outer diameter of each ball is 0.25+/−0.05 mm. This means that the outer diameter of the ball ranges from 0.20 mm to 0.30 mm. As shown in FIGS. 2 and 3, an insert 20 that is one of the components of a device for testing an IC functions to receive the IC. The insert 20 is manufactured with a machining tolerance of +0.02 mm/−0.00 mm such that a distance between two IC guide surfaces 22 of the insert 20 that face each other typically becomes a length that a margin length 0.02 mm is added to 16.6 mm that is the maximum length of the IC. Therefore, the maximum distance between the IC guide surfaces 22 of the insert 20 becomes 16.64 mm. If an IC having a length of 16.40 mm that is the minimum length of the IC is received into the insert 20, a clearance of 0.24 mm (16.64 mm−16.40 mm) occurs. If the IC is placed such that one side thereof is brought into close contact with one guide surface of the insert 20, the IC is displaced from the center of the insert 20 by 0.12 mm. Moreover, in an assembly between the insert 20 and the socket guide 17, a positional tolerance and an assembly tolerance between an insert position guide hole 21 of the insert and an insert position guide pin 19 of the socket guide are added. Also, in an assembly between the socket guide 17 and the socket, a positional tolerance and an assembly tolerance between a socket position guide pin 18 of the socket guide 17 and a socket position guide hole 14 of the socket are added. Thus, the IC that has been displaced from the center of the IC by 0.12 mm may be further displaced therefrom by 0.03 mm or more. As a result, the balls of the IC may be displaced from the correct positions of the centers of the upper pins of the corresponding socket contacts by 0.15 mm or more.

In brief, the IC balls 2 that must be placed at the correct positions on the centers of the upper pins 13 of the respective socket contacts and be electrically connected to upper pins 13 may be displaced from the correct positions by 0.15 mm or more. In the case where the diameter of each ball is 0.20 mm, the outer edge of the ball may be displaced from the center of the upper pin of the corresponding socket contact by 0.05 mm.

FIG. 4 illustrates a normal state in which the lead balls 2 of the IC are precisely disposed at correct positions on the upper pins 13 of the corresponding socket contacts. FIG. 5 illustrates an abnormal state in which the lead balls of the IC are displaced to the left by a distance of d" from the correct positions of the upper pins of the socket contacts. In the case of FIG. 5, abnormal electrical contact is caused. Furthermore, the upper pins 13 of the socket contacts may be bent or broken. As such, a problem of an IC being damaged or a defective test being caused may occur. This problem is one of several significant problems that must be solved in an IC test. Such conventional problems will become more problematic if ICs with lead balls having a narrow pitch of 0.4 mm, 0.35 mm, 0.30 mm, etc. are mainly produced. Therefore, improvement countermeasures to solve the conventional problems in the IC test are required.

PRIOR ART DOCUMENT

Patent Document (Patent document 1) Korean Patent Laid-open Publication No. 10-2009-0011498 (Publication date: Feb. 2, 2009)
(Patent document 2) Korean Patent Laid-open Publication No. 10-2004-0004878 (Publication date: Jan. 16, 2004)
(Patent document 3) Korean Patent Laid-open Publication No. 10-2003-0010423 (Publication date: Feb. 5, 2003)

DISCLOSURE

Technical Problem

Accordingly, the present invention has been made keeping in mind the above problems occurring in the prior art, and an object of the present invention is to provide a socket device for IC tests which can solve a problem of abnormal electrical contact which has been caused in the conventional IC test method when IC leads (balls) are displaced from correct positions of upper pins of socket contacts because of a combination of part tolerance, accumulated tolerance, assembly tolerance and dimensional tolerance between a socket and a socket guide, between the socket guide and an IC insert and between the IC insert and an IC, whereby an IC test can be more efficiently and reliably conducted.

Another object of the present invention is to provide a socket device for IC tests which can precisely test next generation ICs which are provided with leads having narrow pitches of 0.4 mm or less.

Technical Solution

In order to accomplish the above objects, the present invention provides a socket device for IC tests, the socket device being provided with a plurality of spring contacts having upper and lower ends that respectively come into electrical contact with leads of an IC and a socket board, the socket device including: a socket body in which the spring contacts are supported and placed upright; a pin guide plate coupled to an upper portion of the socket body, with an elastic body interposed between the pin guide plate and the socket body, the pin guide plate having a plurality of movement guide holes so that upper ends of the spring contacts protrude from the pin guide plate through the corresponding movement guide holes; and an IC insert into which the IC is inserted from an upper side thereof and seated, the IC insert being coupled to an upper portion of the pin guide plate, with a plurality of spring contact guide holes formed in the IC insert so that the upper ends of the spring contacts protrude from the IC insert through the corresponding spring contact guide holes.

Preferably, the movement guide holes of the pin guide plate guide and protect the upper ends of the spring contacts that protrude upwards from the upper plate provided on the upper surface of the socket body. The spring contact guide holes of the IC insert guide the upper ends of the spring contacts such that they can be precisely electrically connected at correct positions to the leads of the IC.

Advantageous Effects

A socket device for IC tests according to the present invention can solve a problem of abnormal electrical contact which has been caused in the conventional IC test method when IC leads (balls) are displaced from correct positions of upper pins of socket contacts because of a combination of part tolerance, accumulated tolerance, assembly tolerance and dimensional tolerance between a socket and a socket guide, between the socket guide and an IC insert and between the IC insert and an IC. Thereby, an IC test can be more efficiently and reliably conducted.

Figure 1:
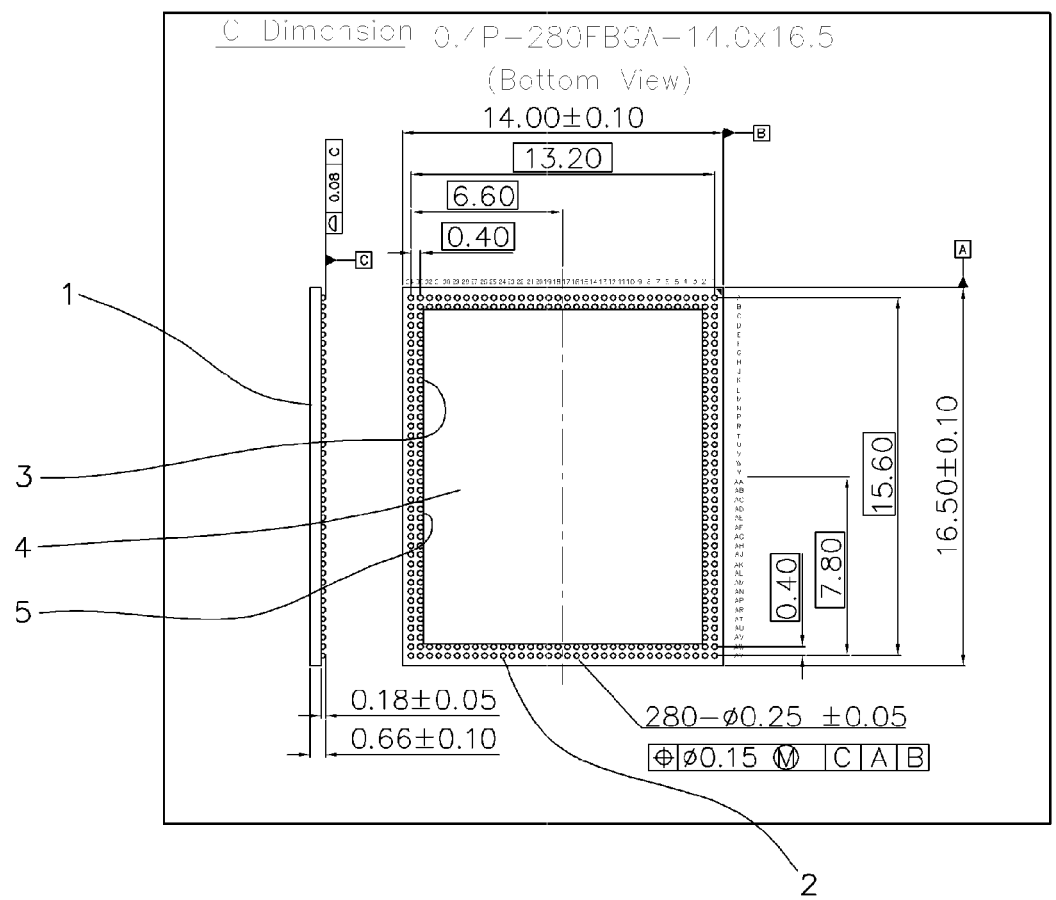
FIG. 1 is a view showing a BGA IC provided with 280 ball leads having 0.4 mm pitch.

DESCRIPTION OF THE REFERENCE NUMERALS IN THE DRAWINGS 1, 6: IC (BGA Type) 2, 7: IC lead
40: insert body 60: guide plate
63: guide hole 64: lead receiving space
66: spring contact guide hole
200, 400, 600: pin guide plate
310, 510, 710: lower plate
320, 520, 720: upper plate
301: spring contact 303: spring contact lower pin
306: upper pin protrusion
307: upper pin protrusion distal end

BEST MODE

Hereinafter, preferred embodiments of the present invention will be described in detail with reference to the attached drawings. The terms and words used in the specification and claims must not be limited to typical or dictionary meanings, but must be regarded as concepts selected by the inventor as concepts which best illustrate the present invention, and must be interpreted as having meanings and concepts adapted to the scope and spirit of the present invention to aid in understanding the technology of the present invention.

Therefore, the construction of the embodiment illustrated in the specification and the drawings must be regarded as only one illustrative example, and these are not intended to limit the present invention. Furthermore, it must be understood that various modifications, additions and substitutions are possible at the point of time of application of the present invention.

A socket device for IC tests according to the present invention is provided to solve a problem of IC leads being displaced from upper pins of corresponding upper contacts which has been caused in the conventional IC test method because of a combination of part tolerance, accumulated tolerance, assembly tolerance and dimensional tolerance between a socket and a socket guide, between the socket guide and an IC insert and between the IC insert and an IC. To achieve the above purpose, a pin guide plate for guiding protrusions of the contact pins is provided on the socket. A socket pin guide plate is provided under the IC insert so that distal ends of the contact pins of the socket can be precisely guided to the corresponding IC leads, whereby electrical and mechanical contact can be more reliably achieved even when tests are repeatedly conducted. In other words, to reliably align the IC leads with the distal ends of the upper pins of the corresponding socket contacts, the pin guide plate is provided in the socket, and the socket pin guide plate is provided in the IC insert.

In brief, although the socket according to the conventional technique has no means for guiding protrusions of contact pins to correct positions, the socket device according to the present invention includes the pin guide plate which functions as a means for guiding the protrusions of the contact pins, and the socket pin guide plate which is provided under the IC insert so that the IC leads (e.g., balls) can come into contact with the upper pins of the corresponding socket contacts at correct positions. Thereby, the present invention can prevent damage to or breakage of the upper pins of the socket contacts or the IC and enhance an IC test yield rate.

Hereinafter, preferred embodiments of the present invention will be described in detail with reference to the attached drawings.

Figure 6:
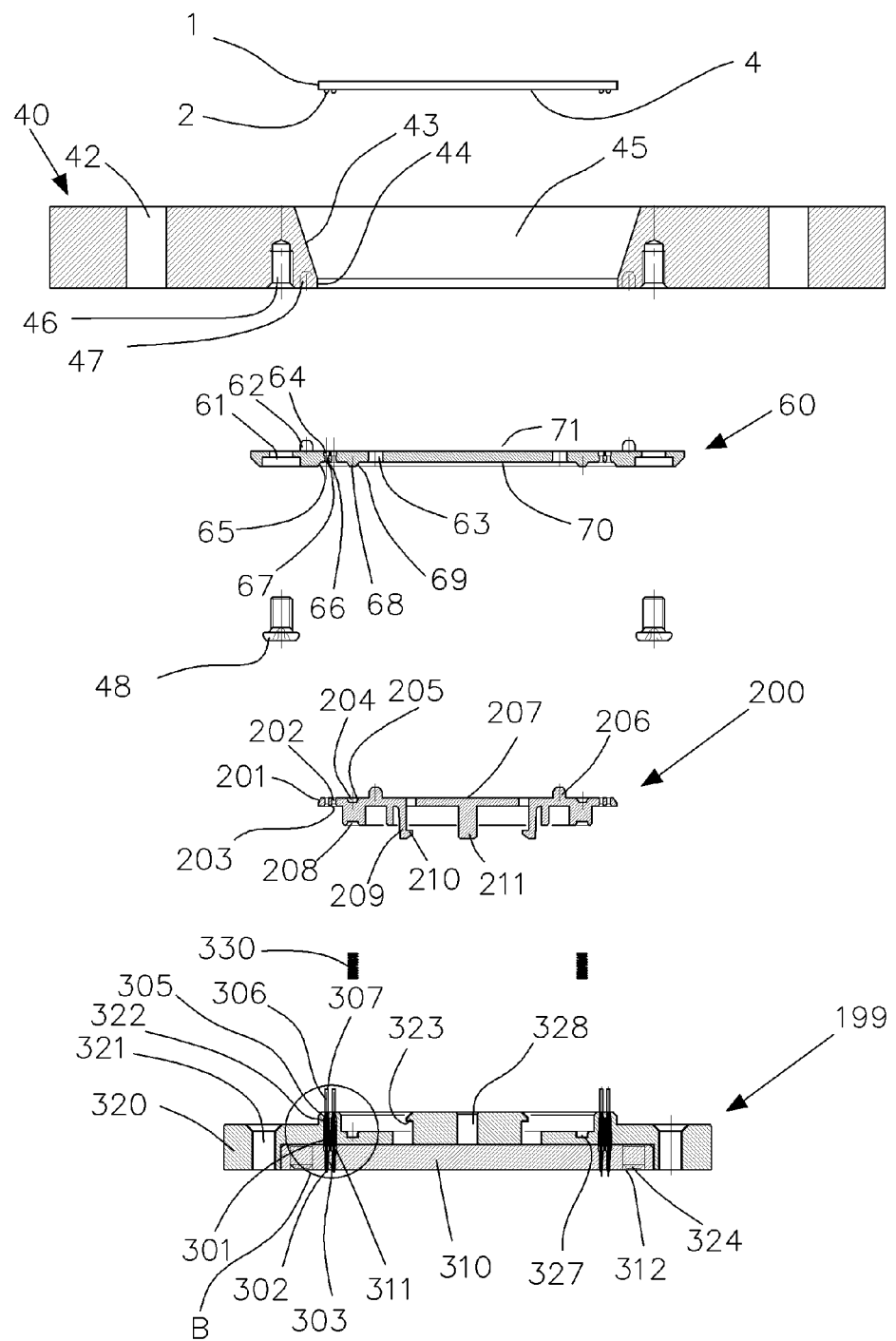
FIG. 6 is an exploded sectional view of a socket device for an integrated circuit (IC) test according to the present invention.
Figure 7:
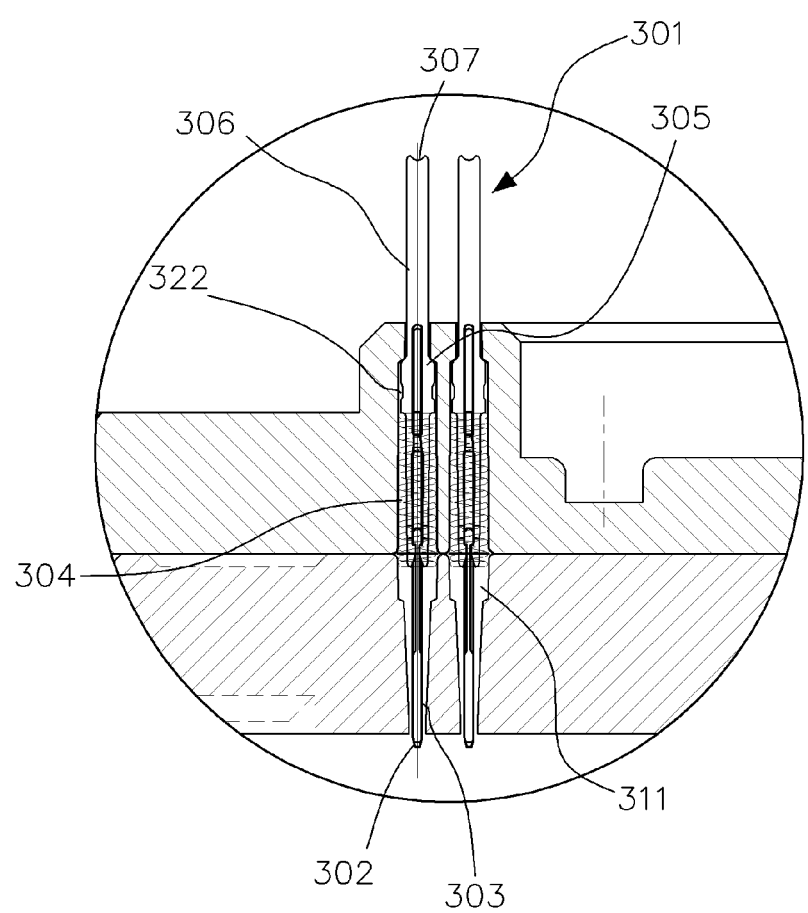
FIG. 7 is a detailed view of portion B of FIG. 6.

FIG. 6 is an exploded sectional view of a socket device for an integrated circuit (IC) test according to the present invention. FIG. 7 is a detailed view of portion B of FIG. 6.

Referring to FIGS. 6 and 7, a socket body 199 includes a lower plate 310 and an upper plate 320 which is coupled to an upper portion of the lower plate 310.

The lower plate 310 has therein a plurality of first movable through holes 311 into which respective spring contacts 301 are inserted in such a way that lower ends of the spring contacts 301 protrude out of the lower plate 310. The upper plate 320 has therein a plurality of second movable through holes 322 into which the corresponding spring contacts 301 are inserted in such a way that upper ends of the spring contacts 301 protrude out of the upper plate 320.

In detail, lower pins 303 of the spring contacts 301 are movably disposed in the respective first movable through holes 311 of the lower plate 310 such that the lower pin 303 of each spring contact 301 protrudes downwards from a lower end of the corresponding first movable through hole 311 and can be electrically connected to a socket board (PCB) which is provided under the socket.

Furthermore, upper pins 306 of the spring contacts 301 are inserted into the corresponding second movable through hole 322 of the upper plate 320 such that the upper pins 306 protrude upwards from upper ends of the second movable through hole 322.

In the present invention, each spring contact 301 can have a variety of shapes. Preferably, the spring contact 301 includes the upper pin 305, the lower pin 303 and a spring 304. The upper pin 305 and the lower pin 303 can be compressibly moved relative to each other with the spring 304 disposed therebetween. Thereby, the spring contact 301 can be compressibly moved upwards or downwards in the corresponding through holes in the upper plate 320 and the lower plate 310. The spring contact 301 functions as an electrical path between the upper plate and the lower plate. A distal end 307 of a protrusion 306 of each upper pin 305 has a downward concave shape so that an electrical resistance between upper pin 305 and a corresponding ball of the IC can be minimized when it comes into contact with the ball of the IC. The shape of the distal end may be changed depending on the shape of the IC leads.

Spring depressions 327 are formed in an upper surface of the upper plate 320 so that elastic bodies 330 can be seated into the respective spring depressions 327 between the upper plate 320 and a pin guide plate 200. The number of spring depressions 327 depends on the number of elastic bodies 330.

In the present invention, a locking protrusion is provided on either the lower plate 310 or the upper plate 320 so that the upper and lower plates 310 and 320 can be hooked to each other by the locking protrusion.

In detail, in this embodiment, a plurality of assembly guide holes 312 and stop protrusions are provided in the lower plate 310. Corresponding to the assembly guide holes 312 and the stop protrusions, assembly guide pins 324 are provided on the upper plate 320. The assembly guide pins 324 are hooked to the respective guide holes 312 and stop protrusions, whereby the lower plate 310 and the upper plate 320 can be hooked to each other. As a result, the assembly between the lower plate 310 and the upper plate 320 can be precisely and conveniently conducted.

Although it is not shown in the drawings, the lower plate and the upper plate may be coupled to each other by bolting.

Particularly, in the present invention, a movement guide hole 328 which functions as a first engagement means is formed in the socket body 199, in more detail, in the upper plate 320. Functioning as a second engagement means, a guide pin 211 which is inserted into the movement guide hole 328 is provided on the pin guide plate 200.

One or more guide pins 211 and movement guide holes 328 may be provided. The guide pin 211 is guided by the movement guide hole 328, whereby the pin guide plate 200 can be seated at a correct position of the upper plate 320 of the socket body 199 when they are assembled with each other.

In the drawings, although the guide pin 211 is illustrated as being provided on the pin guide plate 200 and the movement guide hole 328 is illustrated as being formed in the upper plate 320, the movement guide hole may be formed in the pin guide plate, and the guide pin may be provided on the upper plate.

The pin guide plate 200 is elastically supported by one or more elastic bodies 330 and assembled with the socket body 199, in detail, the upper plate 320.

In the present invention, a locking protrusion 210 is provided on either the socket body or the pin guide plate so that the socket body and the pin guide plate are hooked to each other.

In this embodiment, a stop protrusion 323 is provided on the upper plate 320 of the socket body, and the locking protrusion 210 is provided on the pin guide plate 200. Thus, the locking protrusion 210 is hooked to the stop protrusion 323, whereby the pin guide plate 200 is fastened to the upper plate 320.

The hook coupling structure refers to a structure in which a locking protrusion and a stop protrusion are respectively provided on two members required to be fastened to each other and the locking protrusion is locked to the stop protrusion. Therefore, in the present invention, the locking protrusion can be provided on either the upper plate or the pin guide plate.

Although it is not shown in the drawings, the pin guide plate may be fastened to the upper plate by bolting.

Spring depressions 208 are formed in a lower surface of the pin guide plate 200 so that the elastic bodies 330 can be seated into the respective spring depressions 208. The number of spring depressions 208 depends on the number of elastic bodies 330.

The pin guide plate 200 has therein a plurality of movement guide holes 202 at positions corresponding to the respective spring contacts 301 so that the upper ends of the spring contacts 301 are inserted into the corresponding movement guide holes 202 and protruded upwards from an upper surface of the pin guide plate 200.

Figure 10:
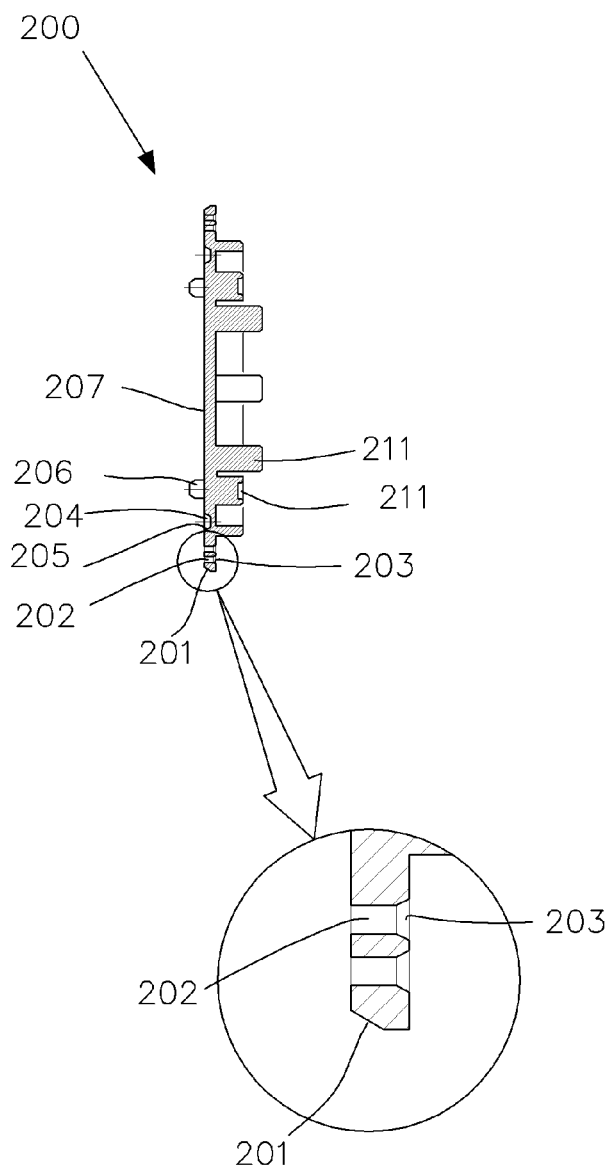

In detail, referring to FIG. 10, an open lower end of each movement guide hole 202 has a first mouth 203 which has a diameter or width larger than that of the movement guide hole 202. Preferably, the first mouth 203 has an inclined surface which is increased in diameter or width from the top to the bottom.

Thanks to such a shape of the movement guide hole 202 of the pin guide plate 200, when each spring contact 301 is inserted into the corresponding movement guide hole 202, the spring contact 301 can be smoothly guided into the movement guide hole 202 along the inclined surface of the first mouth 203. Thereby, the distal end 307 of the spring contact 301 can be prevented from being damaged.

An IC insert receives an IC therein and is used to transport the IC. A plurality of spring contact guide holes 66 are formed in the IC insert. The upper ends of the spring contacts are inserted into the corresponding spring contact guide holes 66 and protruded outwards from upper ends of the spring contact guide holes 66. Leads 2 of the IC are disposed on the corresponding upper contact pins of the test socket so that the IC leads 2, the contact pins and the sock board are mechanically and electrically connected to each other, thus making an electric test possible.

In detail, the IC insert includes an insert body 40 which has therein an IC receiving hole 45 which receives the IC through an open upper end thereof, and a guide plate 60 which has a plurality of spring contact guide holes 66 therein and is coupled to a lower surface of the insert body 40 in such a way that the guide plate 60 covers the IC receiving hole 45.

The insert body 40 has the IC guide hole 45 in a central portion thereof. The IC guide hole 45 is defined by an IC receiving inclined surface 43 and an IC guide surface 44 which are arranged from the top to the bottom and guide the IC so that the IC can be seated into the IC guide hole 45. The insert body includes a plurality of socket guide pin holes 42 which correspond to guide pins of a socket guide.

The guide plate 60 is assembled with the insert body 40. In detail, the guide plate 60 has therein the spring contact guide hole 66 and is fastened to the insert body 40 by a bolt 48. In FIG. 6, reference numeral 46 denotes a bolt hole into which the bolt 48 is tightened.

Although it will be explained again, the guide plate 60 and the insert body 40 may be coupled to each other by a hook coupling structure with a locking protrusion provided on either the guide plate 60 or the insert body 40.

Meanwhile, to dispose the guide plate 60 at a correct position under the insert body 40 when they are assembly with each other, an assembly guide hole 47 is formed in a lower surface of the insert body 40, and an assembly guide pin 62 which is inserted into the assembly guide hole 47 protrudes from an upper surface of the guide plate 60. In FIG. 6, reference numeral 61 denotes a bolt assembly hole into which the bolt is inserted.

Figure 15:
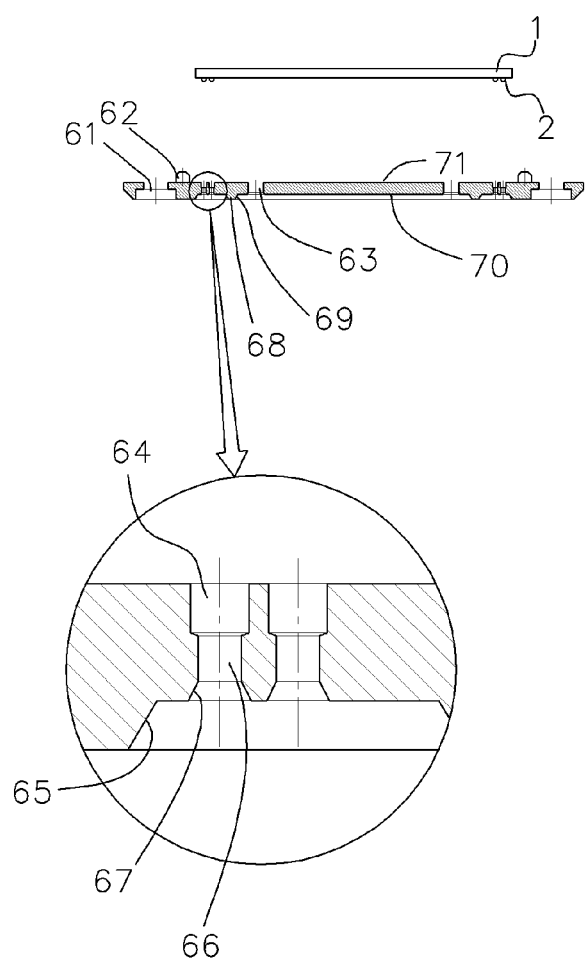

Referring to FIG. 15, each spring contact guide hole 66 which is formed in the IC insert, in detail, in the guide plate 60, has in an open lower end thereof a second mouth 67 which has a diameter or width greater than that of the spring contact guide hole 66. Preferably, the second mouth 67 has an inclined surface which is increased in diameter or width from the top to the bottom.

Thanks to such a shape of the spring contact guide hole 66 of the guide plate 60, when the distal end 307 of each spring contact 301 is inserted into the corresponding spring contact guide hole 66, the distal end 307 can be smoothly guided into the spring contact guide hole 66 along the inclined surface of the second mouth 67. Thereby, the distal end 307 of the spring contact 301 can be prevented from being damaged.

Furthermore, the spring contact guide hole 66 has in an open upper end thereof a lead receiving space 64 which has a diameter greater than that of the spring contact guide hole 66.

The lead receiving space 64 provides a space into which a corresponding lead (ball) of the IC is seated when the IC is received in the IC insert.

The lead receiving spaces of the spring contact guide holes 66 may be formed by a common lead receiving space which is formed by connecting the open upper ends of the two or more spring contact guide holes 66 to each other. Alternatively, in response to a pattern of leads provided on the IC, the lead receiving spaces of the spring contact guide hole 66 may form a block or line shape. Detailed embodiments with regard to this will be explained later herein.

Meanwhile, various kinds of means can be provided to couple the pin guide plate 200 to the lower surface of the IC insert at a correct position. In this embodiment, positioning of the guide plate 60 can be embodied by coupling it along with the pin guide plate 200 to the IC insert.

In detail, in this embodiment, a first inclined surface 201 is formed on a peripheral edge of the pin guide plate 200. Engaging with the first inclined surface 201 of the pin guide plate 200, a second inclined surface 65 is formed in a lower surface of the guide plate 60. A depressed contact surface 70 is formed in the lower surface of the guide plate 60 so that the pin guide plate 200 is seated into the contact surface 70.

A guide pin 206 and a guide hole 63 into which the guide pin 206 is inserted are respectively formed in assembly surfaces of the guide plate 60 and the pin guide plate 200 that face each other. Thereby, the guide plate 60 and the pin guide plate 200 can be assembled with each other only at a correct position.

The locations or shapes of the guide pin 206 or guide hole 63 or the numbers of guide pins 206 or guide holes 63 are not limited, so long as the guide plate 60 and the pin guide plate 200 can be assembled with each other at the correct position. However, it is preferable that the guide pin 206 and the guide hole 63 have, for example, conical inclined surfaces so that the guide pin 206 can reliably engage with the guide hole 63.

As such, there may be a variety of means for guiding the pin guide plate 200 such that the pin guide plate 200 is coupled to the lower surface of the IC insert at the correct position. Any one of the above introduced means may be independently used, or several means may be used together.

Figure 11:
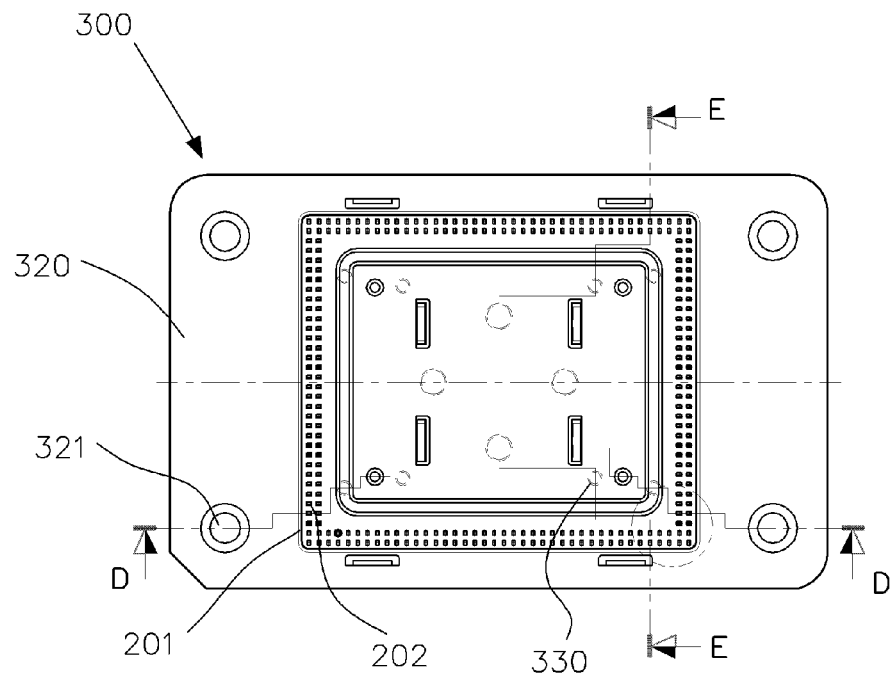
FIGS. 11 through 13 are a plan view and sectional views of the socket device provided with the pin guide plate according to the present invention.
Figure 12:
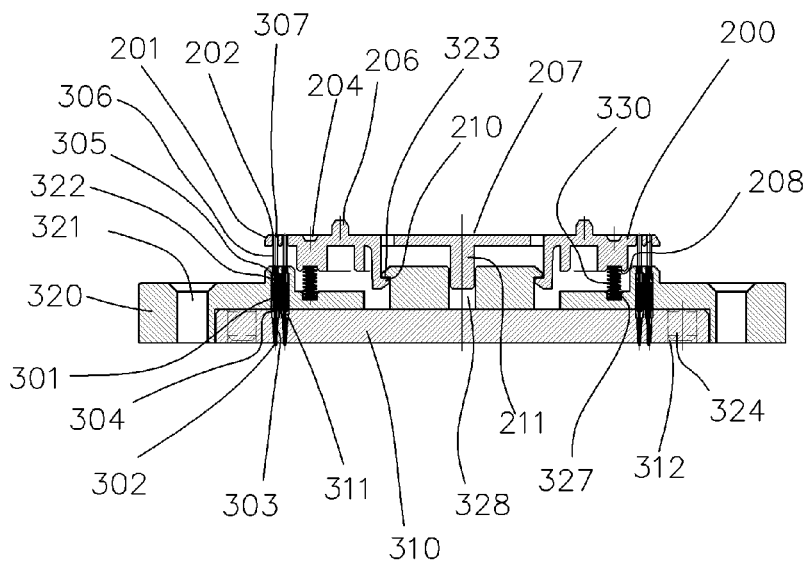
Figure 13:
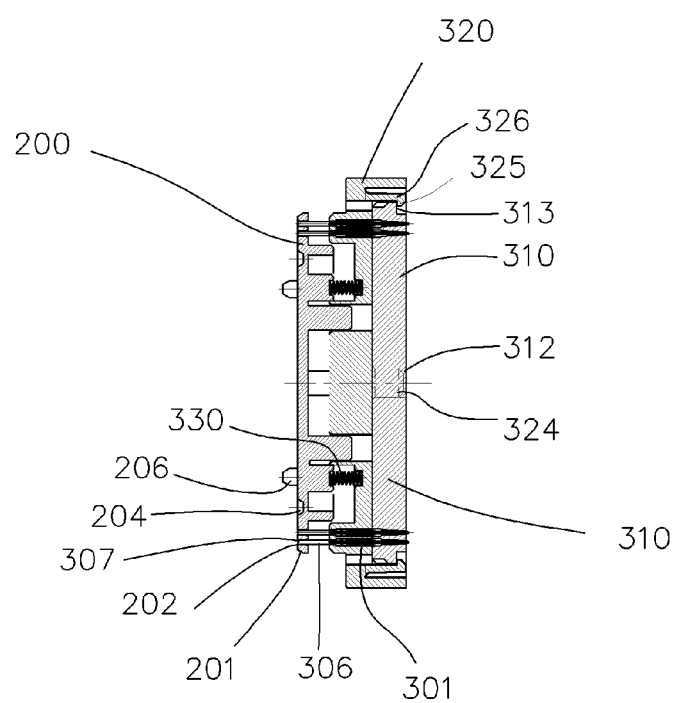

FIG. 11 is a plan view a socket 300 provided with the pin guide plate according to the present invention. FIG. 12 is a sectional view taken along line D-D of FIG. 11. FIG. 13 is a sectional view taken along line E-E of FIG. 11.

The socket includes the upper plate 320, the lower plate 310 which is coupled to the lower surface of the upper plate 320, and the spring contacts 301 which are movably provided between the upper plate and the lower plate. The lower plate has therein the first movable through holes 311. The spring contacts 301 are inserted into the respective first movable through holes 311 in such a way that the lower pins of the spring contacts protrude downwards from the lower plate 310 so that the lower pin protrusions 302 can be electrically connected to the socket board (PCB) which is provided under the socket.

Figure 14:
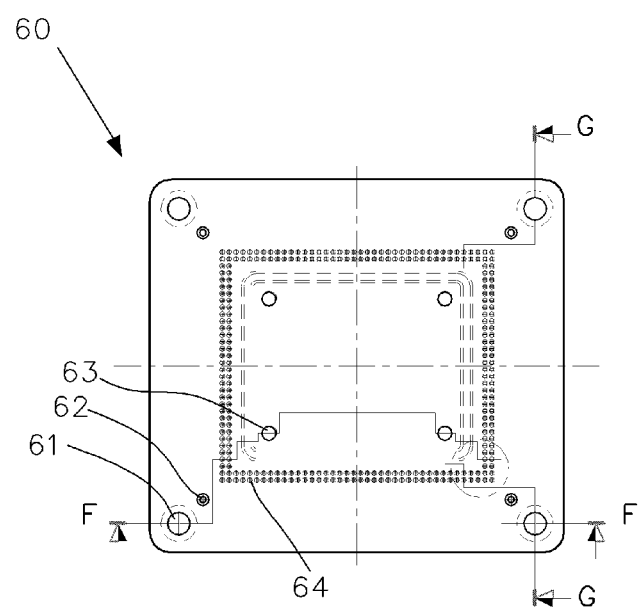
FIGS. 14 through 16 are a plan view and sectional views illustrating a guide plate according to the present invention.
Figure 16:
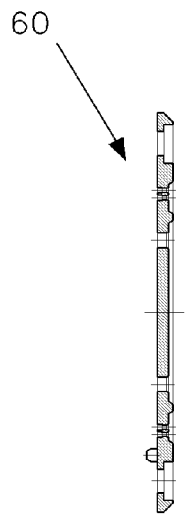

FIG. 14 is a plan view showing the guide plate according to the present invention. FIG. 15 is a sectional view taken along line F-F of FIG. 14. FIG. 16 is a sectional view taken along line G-G of FIG. 14.

The guide plate 60 is provided under the insert body 40. The guide plate 60 has an IC seating surface 71 onto which the IC 1 is seated, and lead receiving spaces 64 which respectively receive a plurality of leads (or balls) of the IC to dispose them at correct positions.

The lead receiving spaces 64 receive the respective leads of the IC. Each lead receiving space 64 has a circular or rectangular shape. A lower end of each lead receiving space 64 is connected to the corresponding second mouth 67 and spring contact guide hole 66. Thus, the upper distal end 307 of each socket contact pin is guided by the corresponding second mouth 67 and spring contact guide hole 66 and passes through the lead receiving space 64 so that lower portion of the corresponding lead (or ball) of the IC that is received in the lead receiving space come into contact with the corresponding upper distal end 307 at a correct position.

Figure 17:
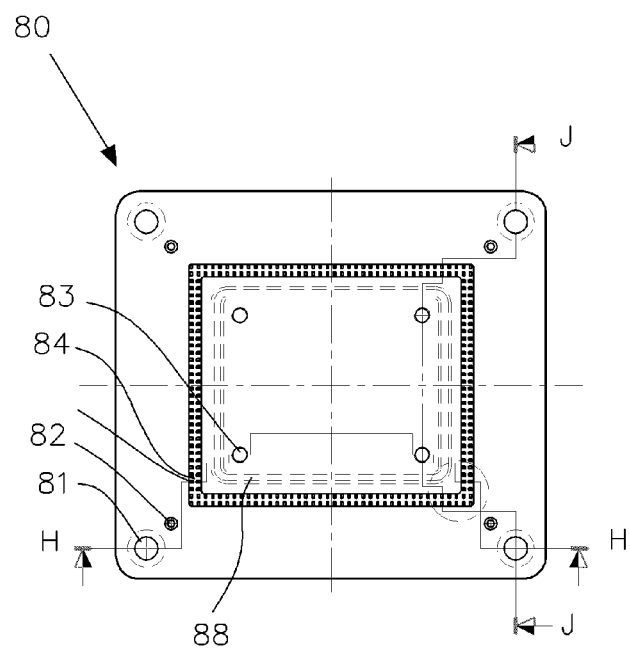
FIGS. 17 through 19 are views showing another embodiment of the guide plate of the socket device for IC tests according to the present invention.
Figure 18:
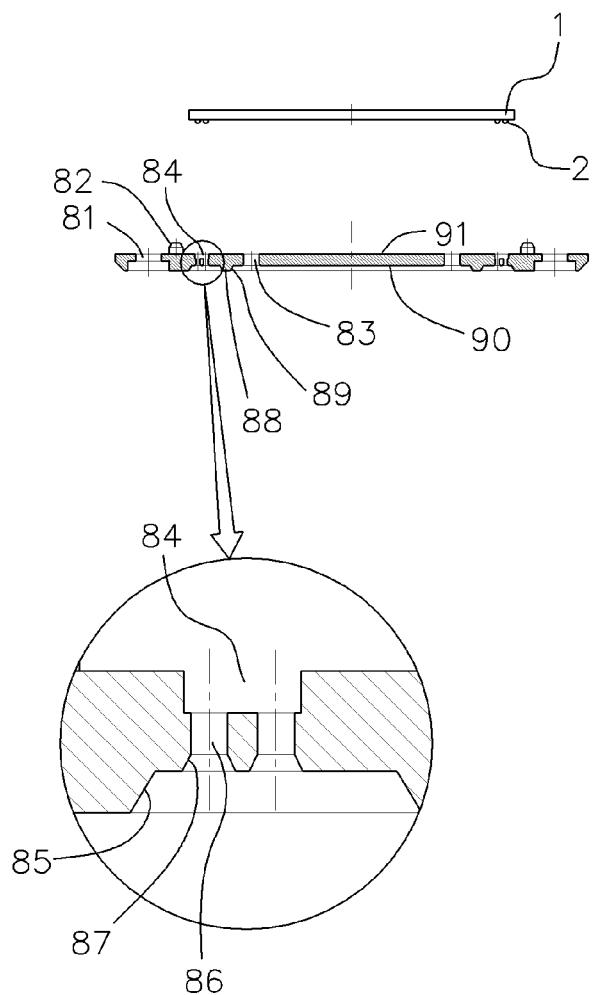
Figure 19:
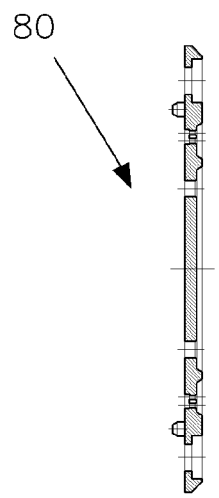

FIGS. 17 through 19 are views illustrating another embodiment of the guide plate of the socket device for IC tests according to the present invention.

Referring to FIGS. 17 through 19, in an embodiment, a lead receiving space 84 is formed in a guide plate 80. In the case of an IC 1 having two rows of balls 2 provided on the perimeter thereof (refer to FIG. 1), the lead receiving space 84 may form a single line shape capable of receiving the two rows of balls 2.

Although it is not shown in the drawings, the lead receiving spaces may be configured according to groups, blocks or rows of the balls. The configuration of the lead receiving spaces is determined by a pattern of arrangement of the IC leads.

For example, referring to FIGS. 1 and 17, in the case where each lead of the IC is a ball type, the lead receiving space 84 of the guide plate 80 may be formed such that an outer connection line which connects outer tangential lines of outer edges of the balls or an inner connection line 5 which connects inner tangential lines 3 of inner edges of the balls is disposed in the lead receiving space 84, whereby the balls of the IC can be reliably guided into the lead receiving space 84. In the case of an IC lead, such as a pad or land type lead, having a planar shape rather than a ball, there is no ball receiving space, and the spring contact guide holes 86 extend to the IC seating surface 91.

Figure 20:
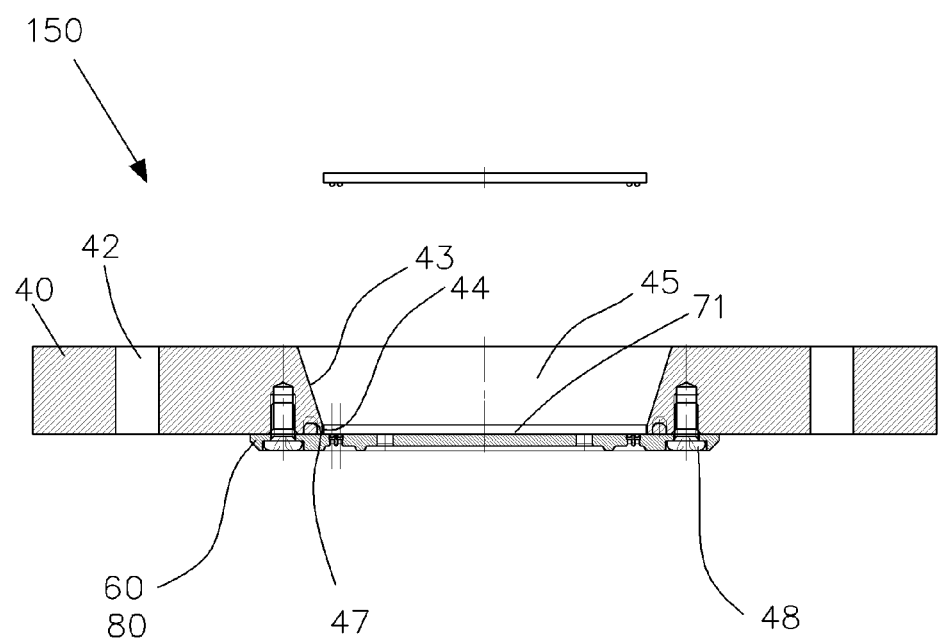
FIG. 20 is a sectional view of an IC insert which includes the guide plate and an insert body that are assembled with each other, in the socket device for IC tests according to the present invention.

FIG. 20 is a sectional view of an IC insert which includes the guide plate and the insert body that are assembled with each other. The IC insert includes an insert body 40 and the guide plate 60, 80 which is coupled to the lower surface of the insert body 40. The insert body 40 has the IC guide hole 45 in a central portion thereof. The IC guide hole 45 is defined by the IC receiving inclined surface 43 and the IC guide surface 44 which are arranged from the top to the bottom and guide the IC so that the IC can be seated into the IC guide hole 45. Corresponding to the guide pins of the socket guide, the socket guide pin holes 42 are formed in the insert body 40.

Although it is not shown in the drawings, typically, the insert body 40 of the IC insert further includes a plurality of rotatable IC holders and holder springs which function as a means for preventing an IC that has been inserted into the IC guide hole 45 and seated onto the IC seating surface 71 of the guide plate 60 from being undesirably moved or removed from the IC seating surface 71.

Figure 21:
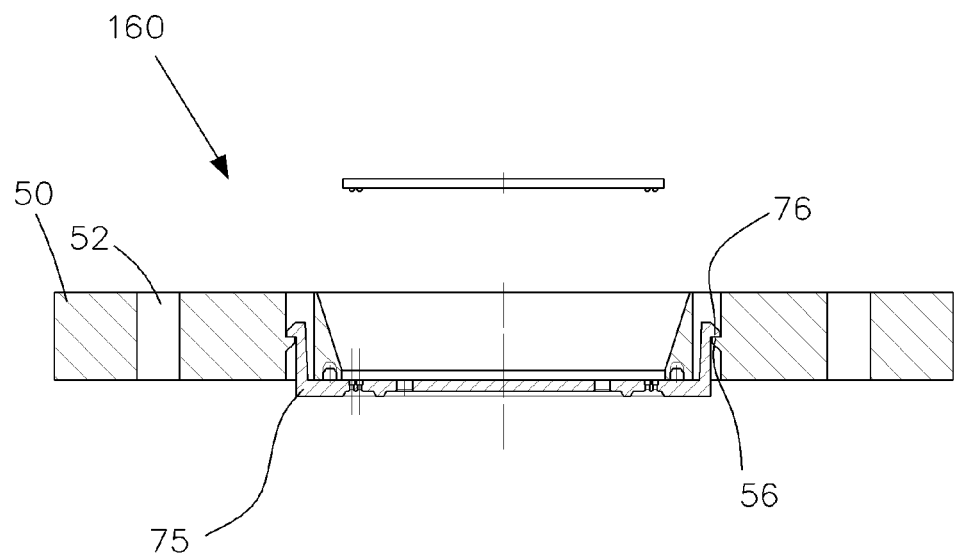
FIG. 21 is a view showing another embodiment of the IC insert of the socket device for IC tests according to the present invention.

FIG. 21 is a view showing another embodiment of the IC insert according to the present invention. In the IC insert 160 according to this embodiment, a locking protrusion 76 is provided on a guide plate 75. A stop protrusion 56, to which the locking protrusion 76 is locked, is provided in the insert body 50. Thereby, the guide plate 75 can be assembled with the insert body 50 by a hook coupling structure.

Of course, the hook coupling structure may be configured in such a way that the locking protrusion is provided on the insert body 50 rather than on the guide plate 75, while the stop protrusion is provided on the guide plate 75.

Figure 22:
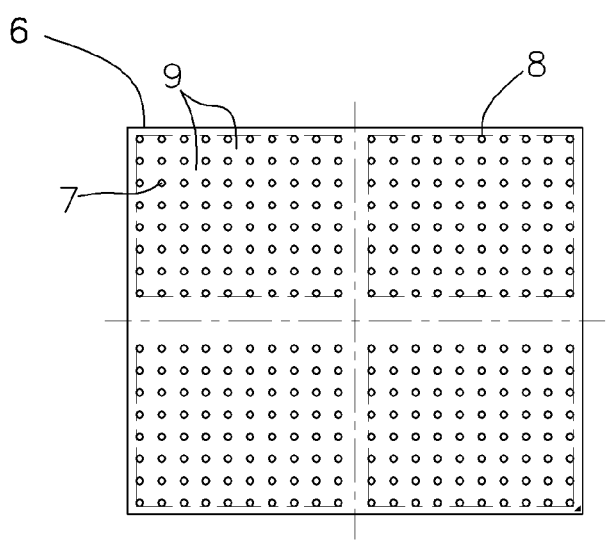
FIGS. 22 and 23 are views showing another type of IC lead to illustrate another embodiment of the socket device for IC tests according to the present invention.
Figure 23:
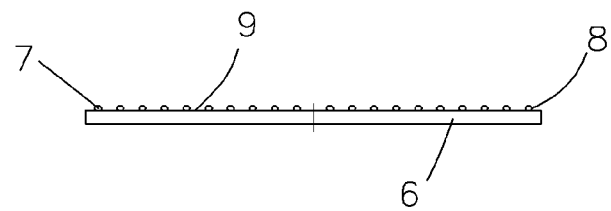

FIGS. 22 and 23 illustrate an IC 6 which is provided with lead balls 7 arranged on the entire area of the bottom thereof, unlike the IC of FIG. 1 in which two rows of balls are arranged on the perimeter thereof. With regard to the IC including lead balls arranged on the entire area thereof, the construction of a socket device of this embodiment differs from that of the socket devices of the embodiments that have been described above. Hereinafter, differences between them will be explained with reference to FIGS. 24 through 37, and some explanation will be omitted if it is overlapped explanation.

Figure 24:
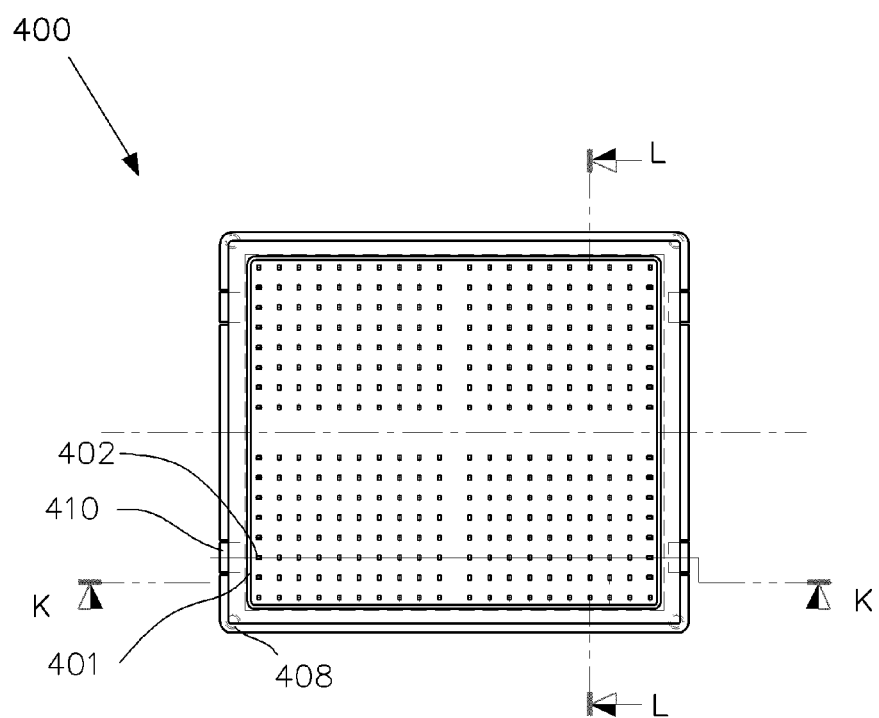
FIGS. 24 through 26 are a plan view and sectional views showing another embodiment of the pin guide plate of the socket device for IC tests according to the present invention.
Figure 25:
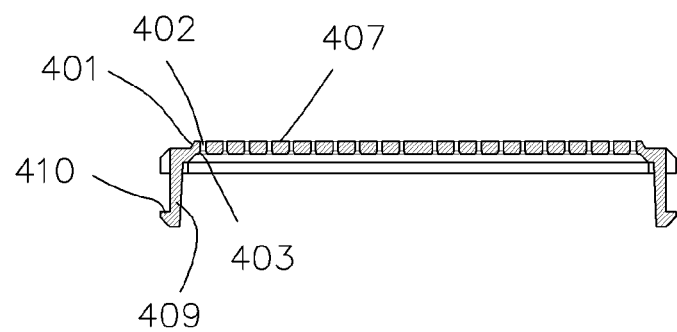
Figure 26:
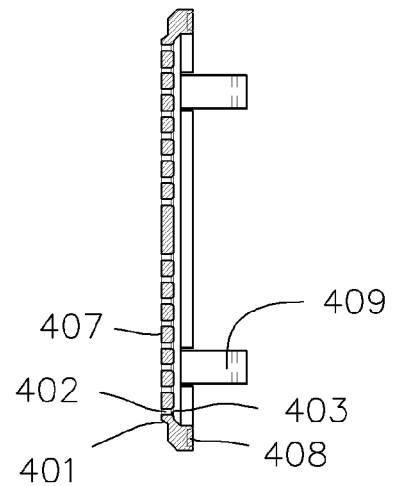

FIG. 24 is a plan view showing another embodiment of the pin guide plate of the socket device. FIG. 25 is a sectional view taken along line K-K of FIG. 24. FIG. 26 is a sectional view taken along line L-L of FIG. 24.

Figure 8:
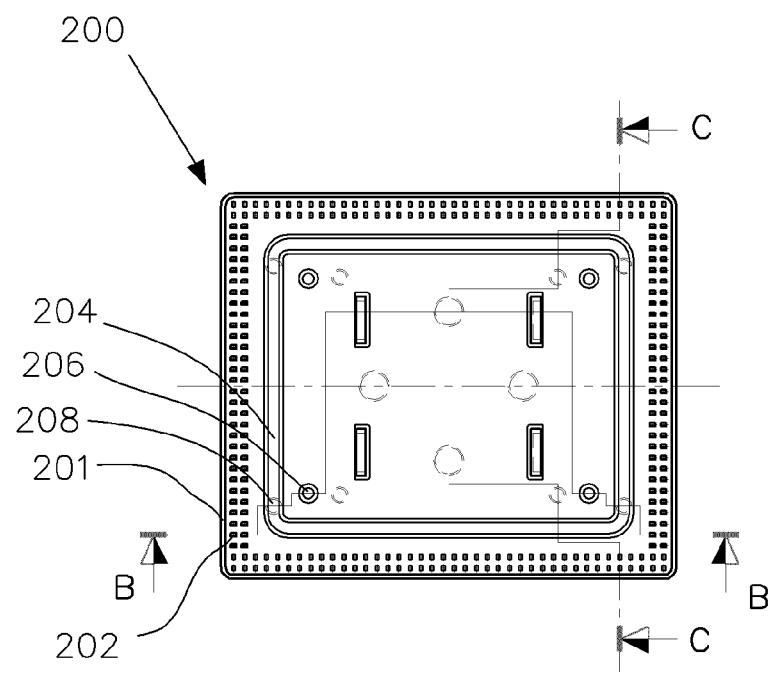
FIGS. 8 through 10 are a plan view and sectional views illustrating a pin guide plate of the socket device for IC tests according to the present invention.
Figure 9:
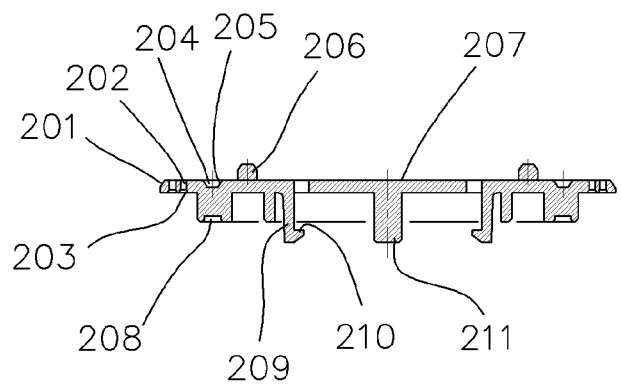

Unlike the pin guide plate 200 of FIGS. 8 through 10 that has been described above, a plurality of movement guide holes 402 into which upper ends of respective spring contacts are inserted are arranged in the entirety of a central portion of a pin guide plate 400. In the same manner as the preceding embodiment, a first mouth 403 may be formed in an open lower end of each movement guide hole 402.

A spring depression 408 is formed in a lower surface of the perimeter of the pin guide plate 400. Providing elasticity between the pin guide plate 400 and the socket body, an elastic body is seated into the spring depression 408.

Figure 27:
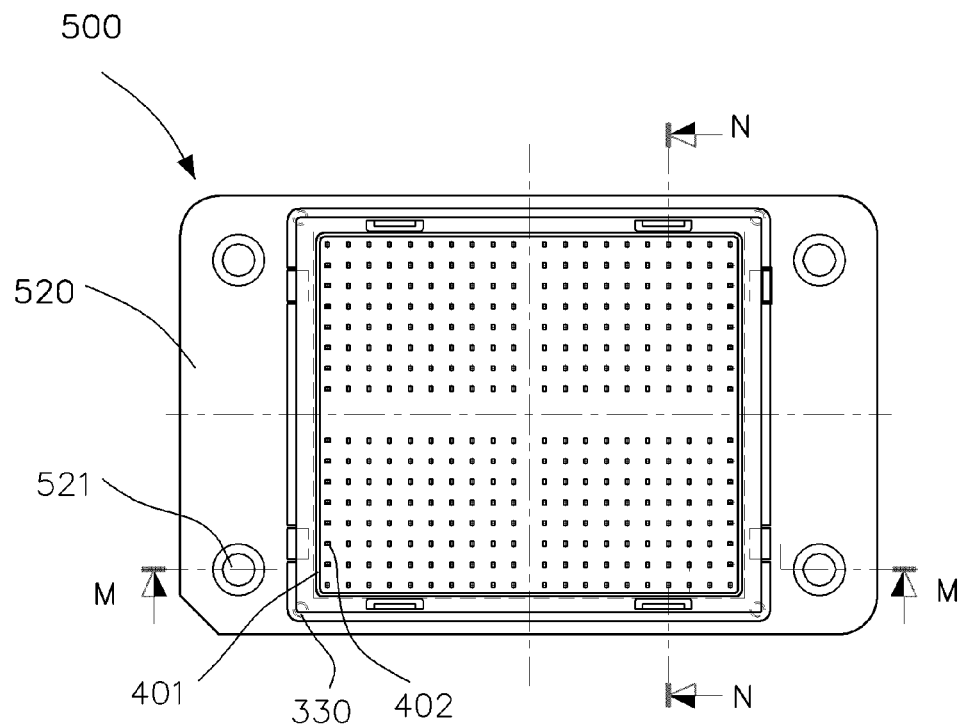
FIGS. 27 through 29 are a plan view and sectional views showing a socket according to another embodiment of the present invention.
Figure 28:
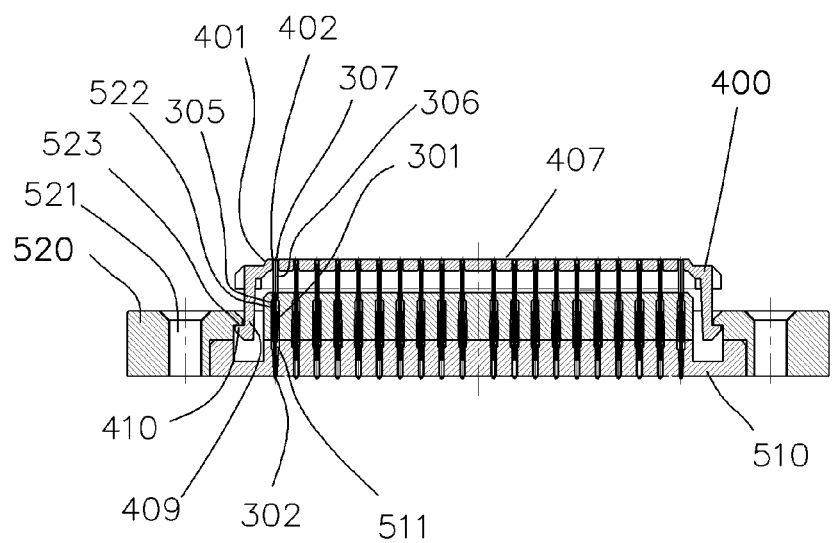
Figure 29:
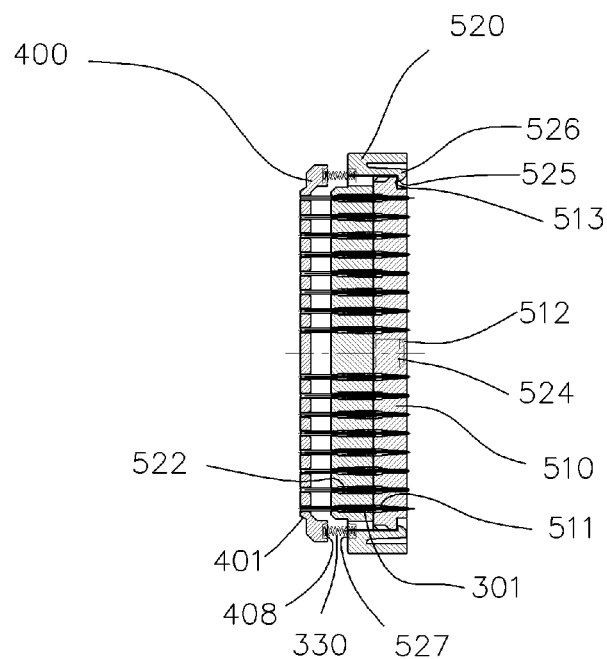

FIG. 27 is a plan view showing a socket 500 according to another embodiment of the present invention. FIG. 28 is a sectional view taken along line M-M of FIG. 27. FIG. 29 is a sectional view taken along line N-N of FIG. 27. Hereinafter, the socket 500, to which the IC having the lead arrangement of FIG. 22 can be applied, will be explained.

The socket 500 includes an upper plate 520, a lower plate 510 which is coupled to a lower surface of the upper plate 520, and a plurality of spring contacts 301 which are provided between the upper plate and the lower plate so as to be movable through the upper and lower plates. The lower plate has a plurality of first movable through holes 511 therein. Lower pins of the spring contacts 301 movably protrude downwards from the lower plate through the respective first movable through holes 511. Lower pin protrusions 302 are electrically connected to a socket board (PCB) provided under the socket.

To achieve correct position assembly with assembly guide pins 524 of the upper plate 520, assembly guide holes 512 and stop protrusions 513 which function as a first engagement means are provided in the lower plate 510. The stop protrusions 513 are coupled to the respective locking protrusions 525 provided on the upper plate 520.

Here, a means for assembling the upper plate and the lower plate with each other may be configured such that the locking protrusions are provided on the lower plate and the stop protrusions are provided on the upper plate so that the upper and lower plates are assembled with each other by a hook coupling structure. In lieu of the combination of the locking protrusion and the stop protrusion, the lower plate and the upper plate may be assembled with each other by bolting.

In this embodiment, a plurality of socket guide holes 521 are formed in the upper plate 520. However, in place of the socket guide holes, a plurality of guide pins may be provided on the upper plate 520. Alternatively, socket guide holes and guide pins may be used together. Furthermore, a plurality of second movable through holes 522 are formed in the upper plate 520, and upper pins of the spring contacts are inserted into the respective second movable through holes 522 and are retractably protruded upwards from the second movable through holes 522.

Furthermore, the assembly guide pins 524 are provided on the upper plate 520 to achieve the correct position assembly with the assembly guide holes 512 of the lower plate 510. The locking protrusions 525 are provided as a means for assembling the lower plate 510 with the upper plate 520.

In addition, a plurality of stop protrusions 523 are provided on the upper plate so that a pin guide plate 400 provided above the upper plate is assembled with the upper plate via the stop protrusions 523. Furthermore, a plurality of elastic spring depressions 527 are formed in the upper plate. Elastically supporting the pin guide plate upwards, a plurality of elastic bodies 330 are provided in the respective elastic spring depressions 527. A plurality of movable guide holes are formed in the upper plate so as to guide respective movable guide pins that are provided on the pin guide plate to guide the elastic movement of the pin guide plate.

Figure 30:
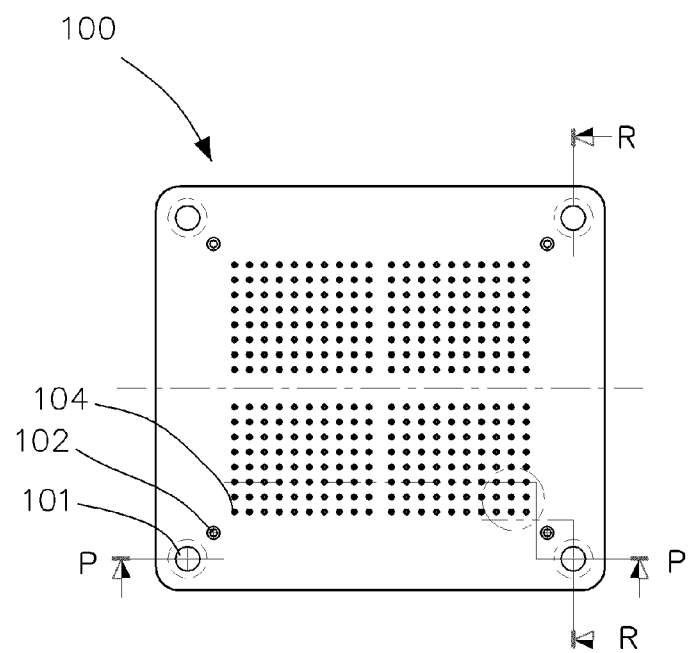
FIGS. 30 through 32 are a plan view and sectional views showing another embodiment of the pin guide plate according to the present invention.
Figure 31:
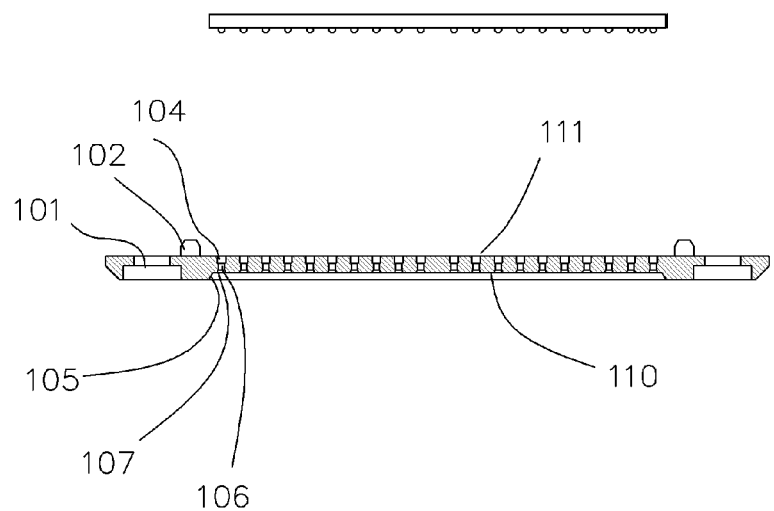
Figure 32:
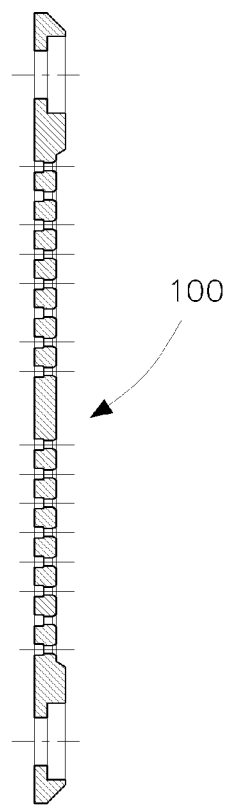

FIG. 30 is a plan view showing another embodiment of the pin guide plate according to the present invention. FIG. 31 is a sectional view taken along line P-P of FIG. 30. FIG. 32 is a sectional view taken along line R-R of FIG. 30.

The pin guide plate 100 is provided under the insert body. An IC seating surface 111 and a plurality of lead receiving spaces 104 are formed in an upper surface of the pin guide plate 100 so that when the IC is placed onto the IC seating surface 111 of the pin guide plate that is coupled to the insert body by bolts, the leads 7 (leads or balls) of the IC are received into the corresponding lead receiving spaces 104 and thus disposed at the correct positions. In the embodiment of FIGS. 30 through 32, the lead receiving spaces 104 each of which has a circular or rectangular shape are arranged to receive the lead balls 7 of the IC 6 that are arranged to be divided into four blocks. A lower end of each lead receiving space 104 is connected to a movement guide hole 106 and a first mouth 107. Thus, the upper distal end 307 of the corresponding socket contact is guided by the movement guide hole 106 and the first mouth 107 and pass through the movement guide hole 106 so that the lower portion of the corresponding lead (or ball) of the IC that is received in the lead receiving space can come into contact with the corresponding upper distal end 307 at a correct position.

Figure 33:
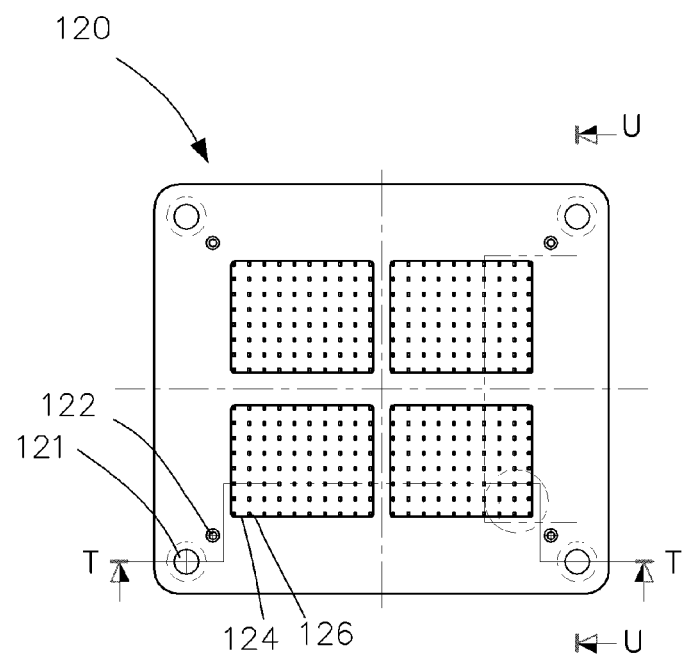
FIGS. 33 through 35 are views showing a modification of the pin guide plate according to the present invention.
Figure 34:
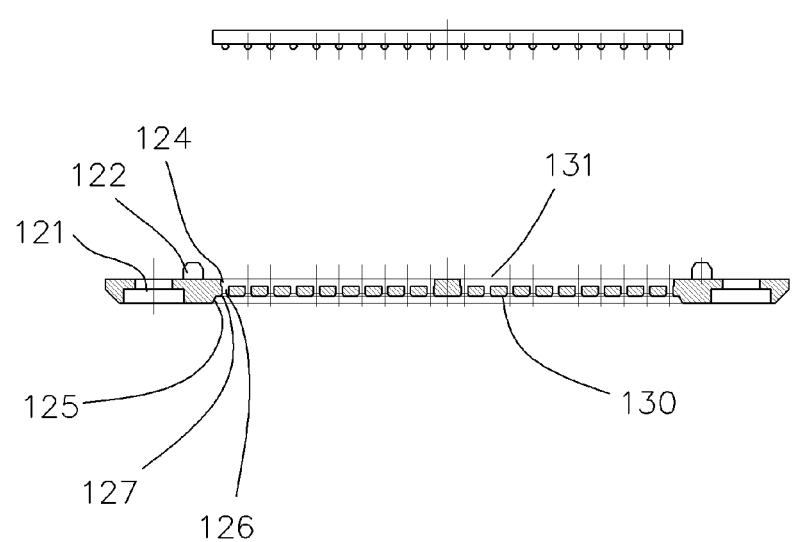
Figure 35:
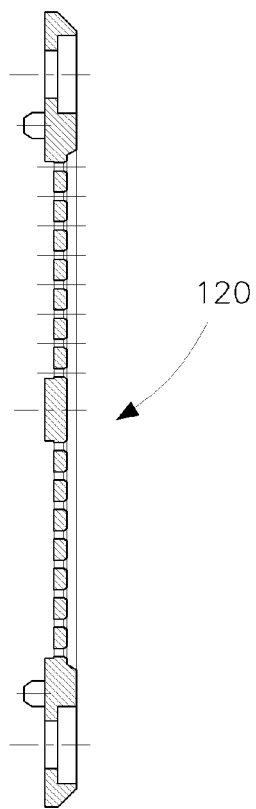

FIGS. 33 through 35 are views of another embodiment of a pin guide plate 120, illustrating a modification of the lead receiving space.

The pin guide plate 120 has lead receiving spaces 124 which are arranged to receive the balls 7 of the IC 5 of FIG. 13 that are arranged to be divided into four groups (blocks).

Although it is not shown in the drawings, the lead receiving spaces may be arranged by rows of the balls. In the case where each lead of the IC is a ball type, a lead receiving space 124 of the pin guide plate 120 may be configured such that, as show in FIG. 22, an outer connection line which connects outer tangential lines of outer edges of the balls of is disposed in the lead receiving space 124. In the case of an IC lead, such as a pad or land type lead having a planar shape rather than a ball, there may be no lead receiving space. In this case, spring contact guide holes 106, 126 extend to the IC seating surface 111, 131.

Figure 36:
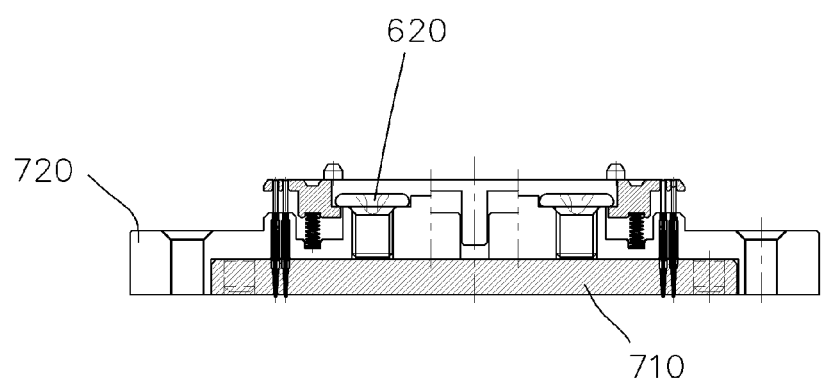
FIG. 36 is a sectional view a modification of the socket of the socket device according to the present invention.

FIG. 36 is a view showing a modification of the socket 300 of the socket device according to the present invention. In this modification, an upper plate 720 and a pin guide plate 600 provided on the upper plate are assembled with each other by a plurality of bolts 620.

The operation of the present invention having the above-mentioned construction will be described with reference to FIGS. 37 through 40.

Figure 37:
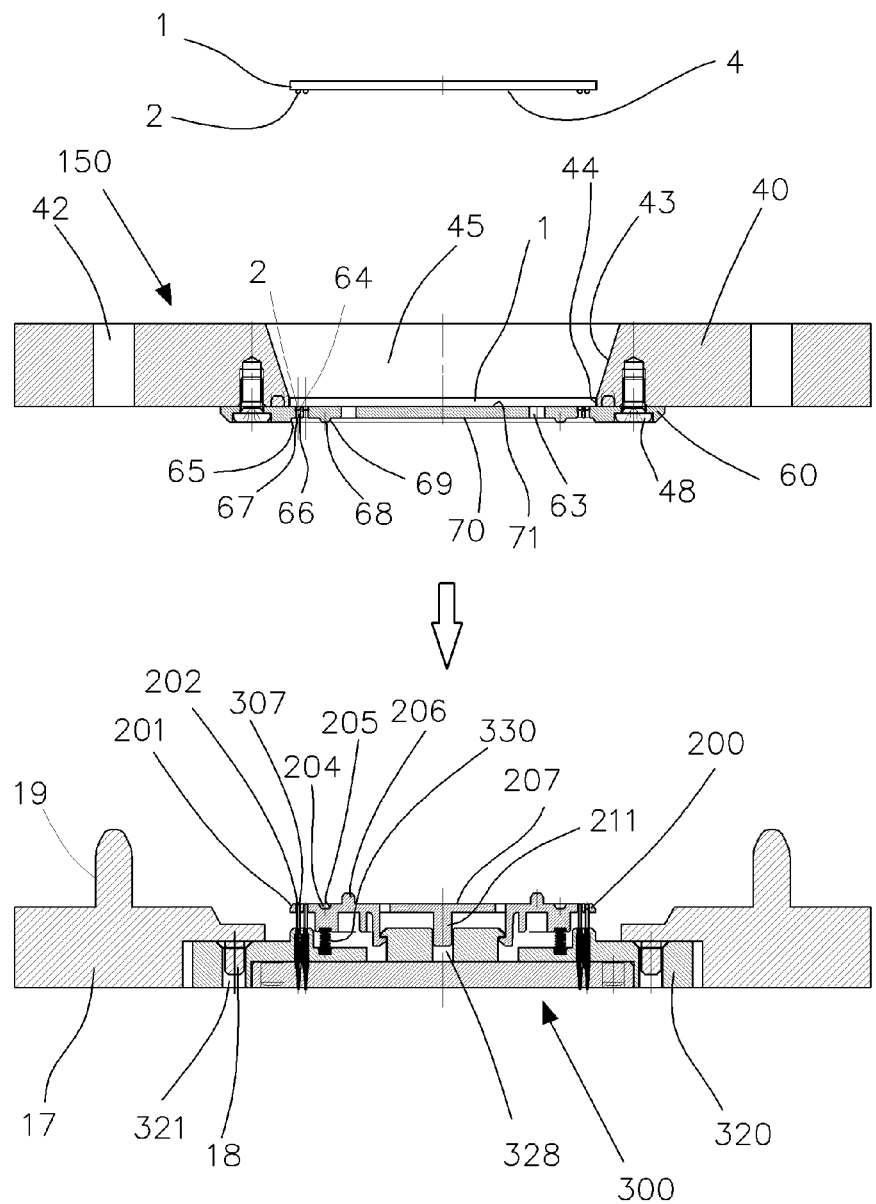
FIGS. 37 through 40 are views illustrating an example of the operation of the socket device for IC tests according to the present invention.

FIG. 37 shows a state in which an IC 1 to be tested is disposed above the insert body 40, and the socket 300 is fastened to the socket guide 17. The socket board (PCB) which is disposed below the socket 300 is not shown in this drawing.

After the IC 1 has been seated in the IC insert 150, a typical test is carried out by bringing the IC insert 150 into contact with the socket 300 in which the socket body 199 and the pin guide plate 200 have been assembled with each other.

Figure 2:
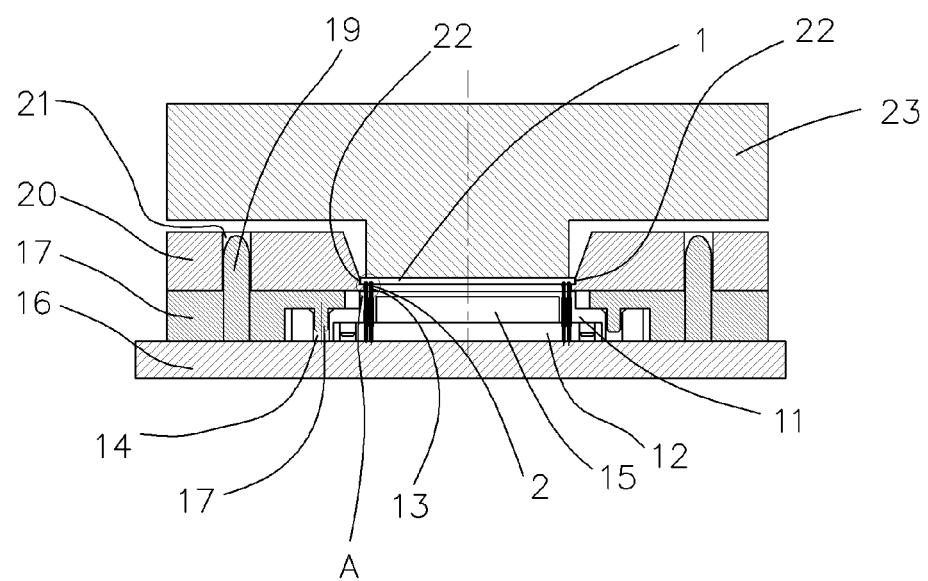
FIG. 2 is a sectional view showing a conventional IC test method.
Figure 3:
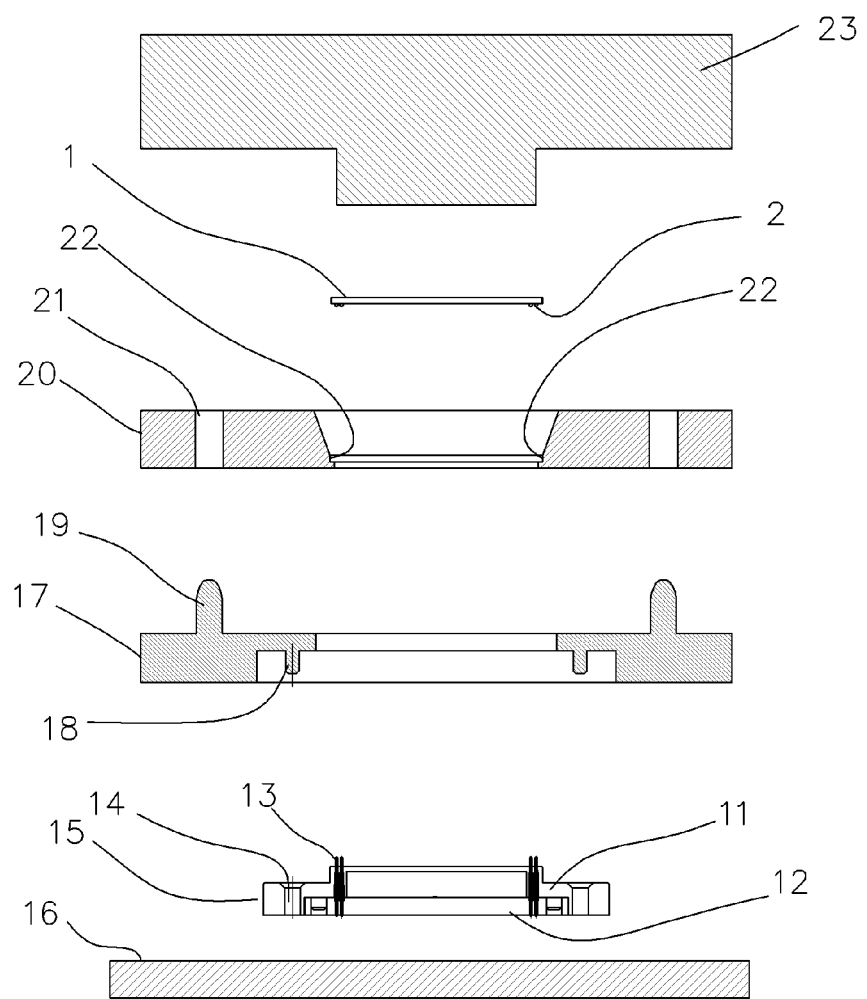
FIG. 3 is a development view of FIG. 2.
Figure 4:
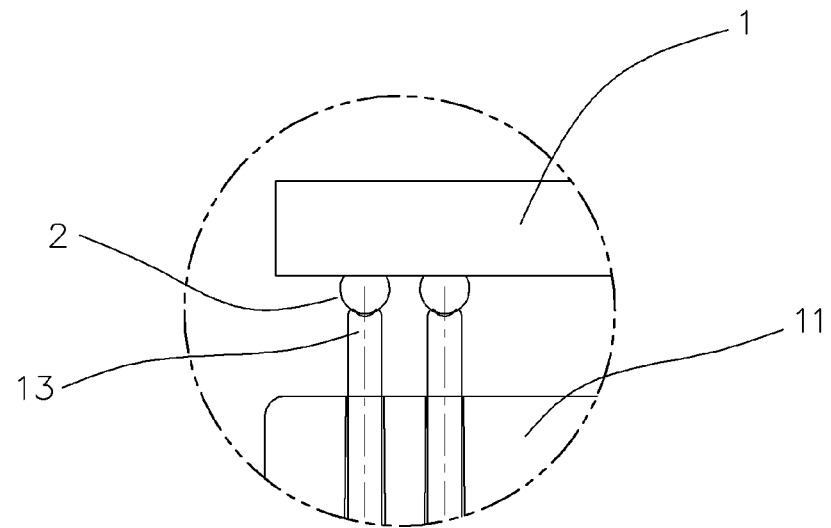
FIG. 4 is a detailed view of portion A of FIG. 2 to illustrate IC leads (balls) disposed at correct positions on upper contact pins.
Figure 5:
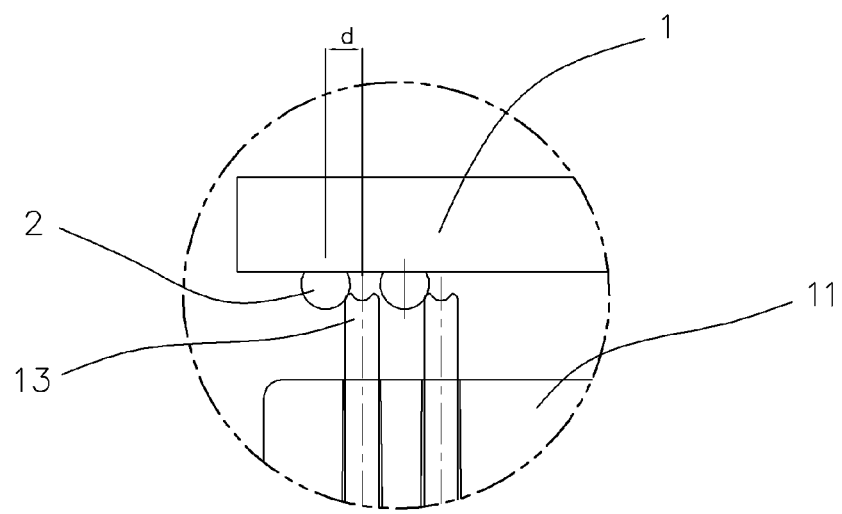
FIG. 5 is a detailed view of portion A of FIG. 2 to illustrate IC leads (balls) displaced from the correct positions of upper contact pins.
Figure 38:
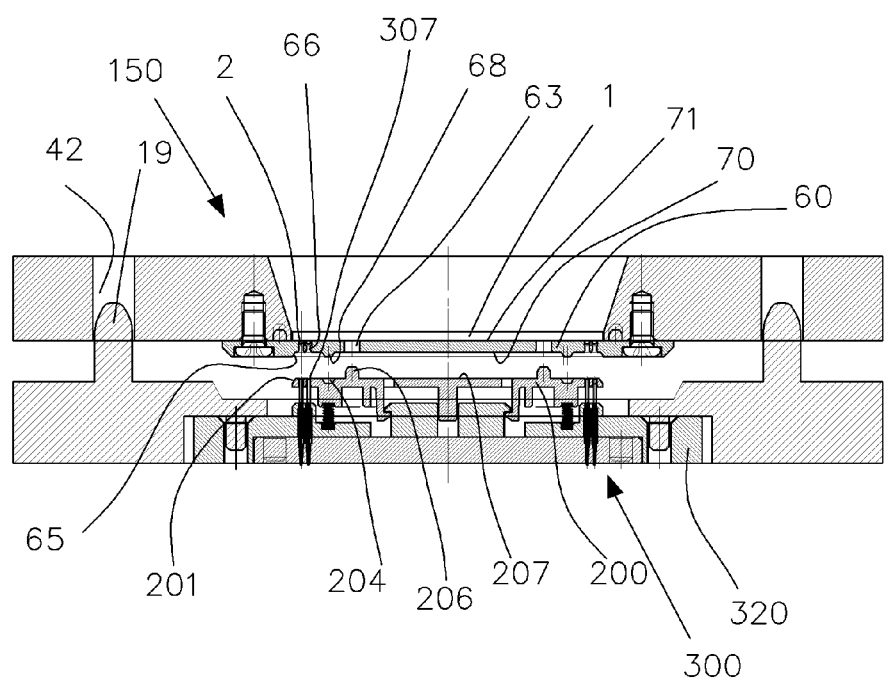

FIG. 38 illustrates a first operation step of the present invention in which the IC insert 150 into which the IC 1 has been seated approaches the upper portion of the socket 300 so that the guide pins 19 of the socket guide 17 are inserted into the respective guide holes 42 of the IC insert. Although it is not shown in FIG. 38, the first operation step refers to an operation in which an IC pusher 23 (refer to FIGS. 2 and 3) pushes downwards the IC 1 that is seated in the IC insert 150.

Figure 39:
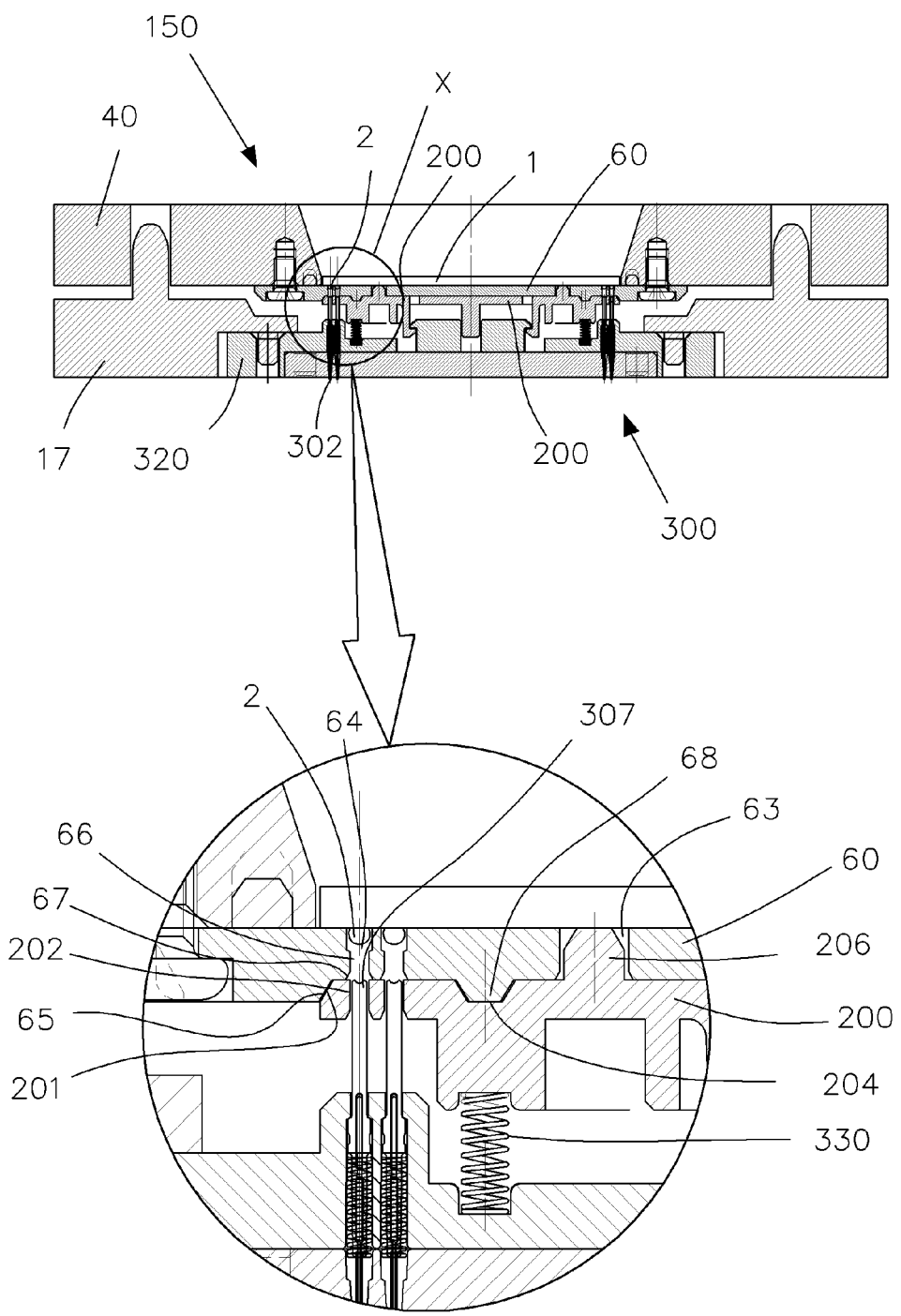

FIG. 39 illustrates a second operation step in which the IC insert 150 further approaches the upper surface of the socket 300, so that the guide plate 60 of the IC insert 150 and the pin guide plate 200 of the socket 300 are brought into contact with each other and are assembled with each other.

In detail, the pin guide plate 200 is assembled with the guide plate 60. Here, the first inclined surface 201 provided on the perimeter of the upper surface of the pin guide plate 200 and the second inclined surface 65 formed under the lower surface of the pin guide plate 60 guide the pin guide plate 200 and the guide plate 60 such that they are assembled with each other at the correct position. Furthermore, the correct-position assembly of the pin guide plate 200 and the guide plate 60 is guided both by a guide groove 204 formed in the upper surface of the pin guide plate 200 and by a guide protrusion 68 which is provided under the lower surface of the pin guide plate 60 and has a guide inclined surface 69. Furthermore, the guide pins 206 provided on the upper surface of the pin guide plate 200 and the guide holes 63 formed in the pin guide plate 60 also function to guide the pin guide plate 200 and the guide plate 60 such that they are assembled with each other at the correct position.

At the second operation step, the assembly between the pin guide plate 60 of the IC insert 150 and the pin guide plate 200 of the socket 300 is embodied. Ultimately, at this step, the protrusion distal ends 307 of the spring contacts of the socket 300 are aligned with the corresponding second mouths 67 and spring contact guide holes 66 of the pin guide plate 60 of the IC insert 150 and are allowed to pass through them, whereby the protrusion distal ends 307 can precisely come into mechanical and electrical contact with the corresponding lead balls of the IC.

Figure 40:
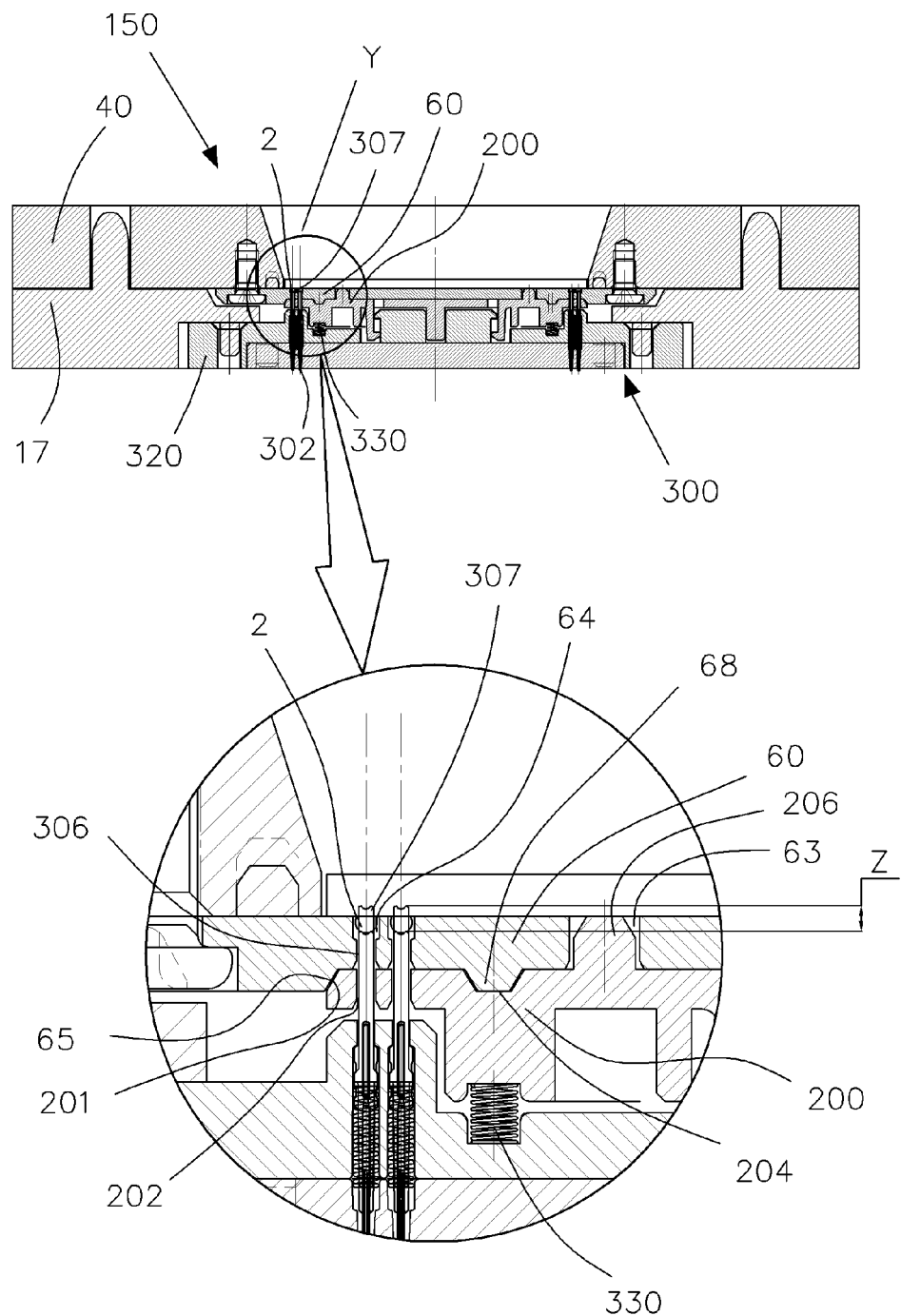

FIG. 40 illustrates a third operation step in which the IC insert 150 completely approaches the upper surface of the socket 300. At this operation step, the pin guide plate 200 of the socket 300 that has been assembled with the pin guide plate 60 of the IC insert 150 is pushed downwards. At this time, the protrusion distal ends 307 of the spring upper contact pins can precisely come into mechanical and electrical contact with the corresponding IC lead balls after passing through the corresponding second mouths 67 and spring contact guide holes 66 which are the pin guide plate 60 of the IC insert 150.

Typically, after the IC lead balls push the protrusion distal ends 307 of the corresponding spring contacts downwards by a distance Z, an electrical test is conducted. The distance Z is generally about 0.3 mm.

Therefore, unlike the conventional socket, in the socket device for IC tests according to the present invention, the upper pin protrusions 306 of the spring contacts can be prevented from being bent or damaged. Furthermore, the distal ends 307 of the spring contacts can precisely come into mechanical and electrical contact with the corresponding IC lead balls through the contact guide holes 67 and the second mouth 66 of the IC insert which guide the positions of the upper contact pin protrusions. As a result, the IC test can be more reliably and effectively conducted.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A socket device for IC tests, the socket device comprising:
a socket body including
an upper plate having
first through holes,
movement guide holes formed in a central portion of the upper plate, and
stop protrusions formed to protrude toward lateral directions of the upper plate,
a lower plate coupled to a bottom side of the upper plate and having second through holes formed in a position corresponding to the first through holes, and
spring contacts, each of the spring contacts being inserted into corresponding one pair of the first and second through holes;
a pin guide plate coupled to a top side of the socket body, the pin guide plate having
first spring contact guide holes formed in a position corresponding to the first and second through holes so that the spring contacts protrude from the pin guide plate through the first spring contact guide holes,
lower guide pins protruding from a bottom side of the in guide plate and inserted into the movement guide holes of the socket body,
locking protrusions protruding from the bottom side of the in guide plate and engaged with the stop protrusions of the socket body, and
upper guide pins protruding from a top side of the in guide plate;
an IC insert body having
an IC receiving hole formed in a central portion of the IC insert body, into which an integrated circuit (IC) is inserted from an upper side thereof and seated, and
assembly guide holes formed around the IC receiving hole in a bottom side of the IC insert body; and
a guide plate coupled to the bottom side of the IC insert body and separated from the pin guide plate, the guide plate having
second spring contact guide holes formed in a position corresponding to the first spring contact guide holes of the pin guide plate so that the spring contacts protrude from the guide plate through the second spring contact guide holes,
positioning guide holes into which the upper guide pins of the in guide plate are inserted, and
assembly guide pins protruding from a top side of the guide plate and inserted into the assembly guide holes of the IC insert body.

2. The socket device for IC tests of claim 1, wherein each of the first spring contact guide holes has a first mouth in a lower portion thereof having a diameter greater than a diameter of the first spring contact guide hole.

3. The socket device for IC tests of claim 1, wherein each of the second spring contact guide holes has a second mouth in a lower portion thereof having a diameter greater than a diameter of the second spring contact guide hole.

4. The socket device for IC tests of claim 1, wherein the guide plate has a lead receiving space formed in an upper portion of each of the second spring contact guide holes, the lead receiving space having a diameter greater than a diameter of the second spring contact guide hole.

5. The socket device for IC tests of claim 1, wherein the guide plate comprises a common lead receiving space formed by connecting upper portions of the two or more second spring contact guide holes to each other.

6. The socket device for IC tests of claim 5, wherein the common lead receiving space has a block or line shape in response to a pattern of arrangement of leads provided on the IC.

7. The socket device for IC tests of claim 1, wherein a first inclined surface is formed on a peripheral edge of the pin guide plate,
   a second inclined surface is formed in a bottom side of the guide plate, the second inclined surface engaging with the first inclined surface of the pin guide plate, and
   a depressed contact surface is formed in the bottom side of the guide plate so that the pin guide plate is seated into the depressed contact surface.

8. The socket device for IC tests of claim 1, wherein the guide plate and the pin guide plate respectively have assembly surfaces facing each other, and the upper guide pins are inserted into the positioning guide holes, whereby the guide plate and the pin guide plate are assembled with each other at a correct position.

9. The socket device for IC tests of claim 8, wherein the upper guide pins and the positioning guide holes respectively have inclined surfaces so that the upper guide pins and the positioning guide holes engage with each other.

10. The socket device for IC tests of claim 1, wherein the socket body and the pin guide plate are coupled to each other by a bolt.

11. The socket device for IC tests of claim 1, wherein the lower plate and the upper plate are coupled to each other by a bolt.

12. The socket device for IC tests of claim 1, wherein said each of the spring contact includes
    an upper pin disposed in the corresponding one of the first through holes,
    a lower pin disposed in the corresponding one of the second through holes, and
    a spring disposed between the upper pin and the lower pin.

13. The socket device for IC tests of claim 1, further comprising elastic bodies disposed between the upper plate of the socket body and the pin guide plate and elastically supporting the pin guide plate on the socket body.

14. The socket device for IC tests of claim 1, further comprising
    socket guide for fixing the socket body to the IC insert body, the socket guide including socket guide pins on a top side thereof,
    wherein the IC insert body includes socket guide holes into which the socket guide pins of the socket guide are inserted.

15. The socket device for IC tests of claim 14, wherein the socket guide further includes socket position guide pins, and
    the upper plate of the socket body includes socket position guide holes into which the socket position guide pins of the socket guide are inserted.

\* \* \* \* \*